(12) United States Patent
Alameldeen et al.

(10) Patent No.: US 9,292,449 B2
(45) Date of Patent: Mar. 22, 2016

(54) CACHE MEMORY DATA COMPRESSION AND DECOMPRESSION

(71) Applicants: Alaa R. Alameldeen, Hillsboro, OR (US); Niranjan L. Cooray, Folsom, CA (US); Jayesh Gaur, Bangalore, IN (US); Steven D. Pudar, Folsom, CA (US); Manuel A. Aguilar Arreola, Folsom, CA (US); Margareth E. Marrugo, El Dorado Hills, CA (US); Chinnakrishnan Ballapuram, Milpitas, CA (US)

(72) Inventors: Alaa R. Alameldeen, Hillsboro, OR (US); Niranjan L. Cooray, Folsom, CA (US); Jayesh Gaur, Bangalore, IN (US); Steven D. Pudar, Folsom, CA (US); Manuel A. Aguilar Arreola, Folsom, CA (US); Margareth E. Marrugo, El Dorado Hills, CA (US); Chinnakrishnan Ballapuram, Milpitas, CA (US)

(73) Assignee: Intel Corporation, Santa Clara, CA (US)

( * ) Notice: Subject to any disclaimer, the term of this patent is extended or adjusted under 35 U.S.C. 154(b) by 125 days.

(21) Appl. No.: 14/136,416

(22) Filed: Dec. 20, 2013

(65) Prior Publication Data

US 2015/0178214 A1  Jun. 25, 2015

(51) Int. Cl.
*G06F 12/08* (2006.01)
*H03M 7/30* (2006.01)
*G06F 17/30* (2006.01)

(52) U.S. Cl.
CPC ........ *G06F 12/0875* (2013.01); *G06F 12/0802* (2013.01); *G06F 17/30153* (2013.01); *H03M 7/3086* (2013.01); *H03M 7/3091* (2013.01); *G06F 2212/401* (2013.01)

(58) Field of Classification Search
CPC ......... G06F 12/0875; G06F 17/30153; H03M 7/3086; H03M 7/3091
See application file for complete search history.

(56) References Cited

U.S. PATENT DOCUMENTS

| | | | |
|---|---|---|---|
| 2005/0160234 A1* | 7/2005 | Newburn et al. | 711/144 |
| 2006/0047916 A1* | 3/2006 | Ying | G06F 12/0802 711/144 |
| 2009/0245382 A1* | 10/2009 | Ekman | 375/240.24 |

* cited by examiner

*Primary Examiner* — Edward Dudek, Jr.
(74) *Attorney, Agent, or Firm* — Lowenstein Sandler LLP

(57) ABSTRACT

A cache memory data compression and decompression technique is described. A processor device includes a memory controller unit (MCU) coupled to a main memory and a cache memory. The MCU includes a cache memory data compression and decompression module that compresses data received from the main memory. The compressed data may then be stored in the cache memory. The cache memory data compression and decompression module may also decompress data that is stored in the cache memory. For example, in response to a cache hit for data requested by a processor, the compressed data in the cache memory may be decompressed and subsequently read or operated upon by the processor.

23 Claims, 12 Drawing Sheets

CACHE MEMORY DATA COMPRESSION AND DECOMPRESSION

TECHNICAL FIELD

Embodiments described herein generally relate to processing devices and, more specifically, relate to cache memory data compression and decompression associated with processing devices.

BACKGROUND

A processing device may use a cache memory to reduce an average time for the processing device to access data. The cache memory may store copies of data that are also stored at a main memory. In general, the cache memory may have a smaller data capacity than the main memory, but the cache memory may be faster than the main memory and thus allows for comparatively faster access to data stored on the cache memory as opposed to corresponding data stored on the main memory. The cache memory may be used to store copies of data that are frequently used or accessed by the processing device.

DESCRIPTION OF EMBODIMENTS

Described herein is a cache memory data compression and decompression technology. In some embodiments, the cache memory data compression and decompression technology may be used to improve the performance of a processor, processing device, or a processor-based system. A processor includes multiple functional units, multiple memory channels, and a memory controller unit (MCU) coupled between them. The MCU includes a cache memory data compression and decompression module that includes compression and decompression function blocks that may be used to compress data that is to be stored in the cache memory and to decompress data that has been retrieved from the cache memory.

Modern microprocessor-based products, including a System on a Chip (SoC), clients, servers, and hardware accelerators, utilize a cache memory to improve performance by storing frequently accessed data on the cache memory. The use of an algorithm to compress and decompress data stored in the cache memory may be used to increase the effective capacity of the cache memory without increasing the physical capacity or size of the cache memory. For example, data to be stored in the cache memory may first be compressed and then subsequently stored on the cache memory. Such compression of data may allow for an increased amount of data to be stored in the cache memory. Furthermore, when the compressed data stored on the cache memory is retrieved (e.g., based on a cache hit), the compressed data may first be decompressed and then subsequently accessed or read by a processor. Although the use of the cache memory data compression and decompression algorithm may increase the overall performance of the processor-based product by increasing the amount of data that may be stored in the cache memory, the compression and decompression stages of the algorithm may each be associated with an increased latency. The increased latency may be measured as the time required for the processor to perform the compression and decompression stages. A significant increase in the latency at either the compression stage or the decompression stage may eliminate or minimize the gain in performance obtained by increasing the effective capacity of the cache memory. As such, in some embodiments such as a high frequency processor environment, an optimized cache memory data compression and decompression algorithm may be used to compress and decompress data associated with the cache memory while also exhibiting lower latency. Such an optimized algorithm may also result in advantageous hardware designs by simplifying circuitry needed to perform the compression and decompression stages of the cache memory data compression and decompression algorithm.

Figure 1:
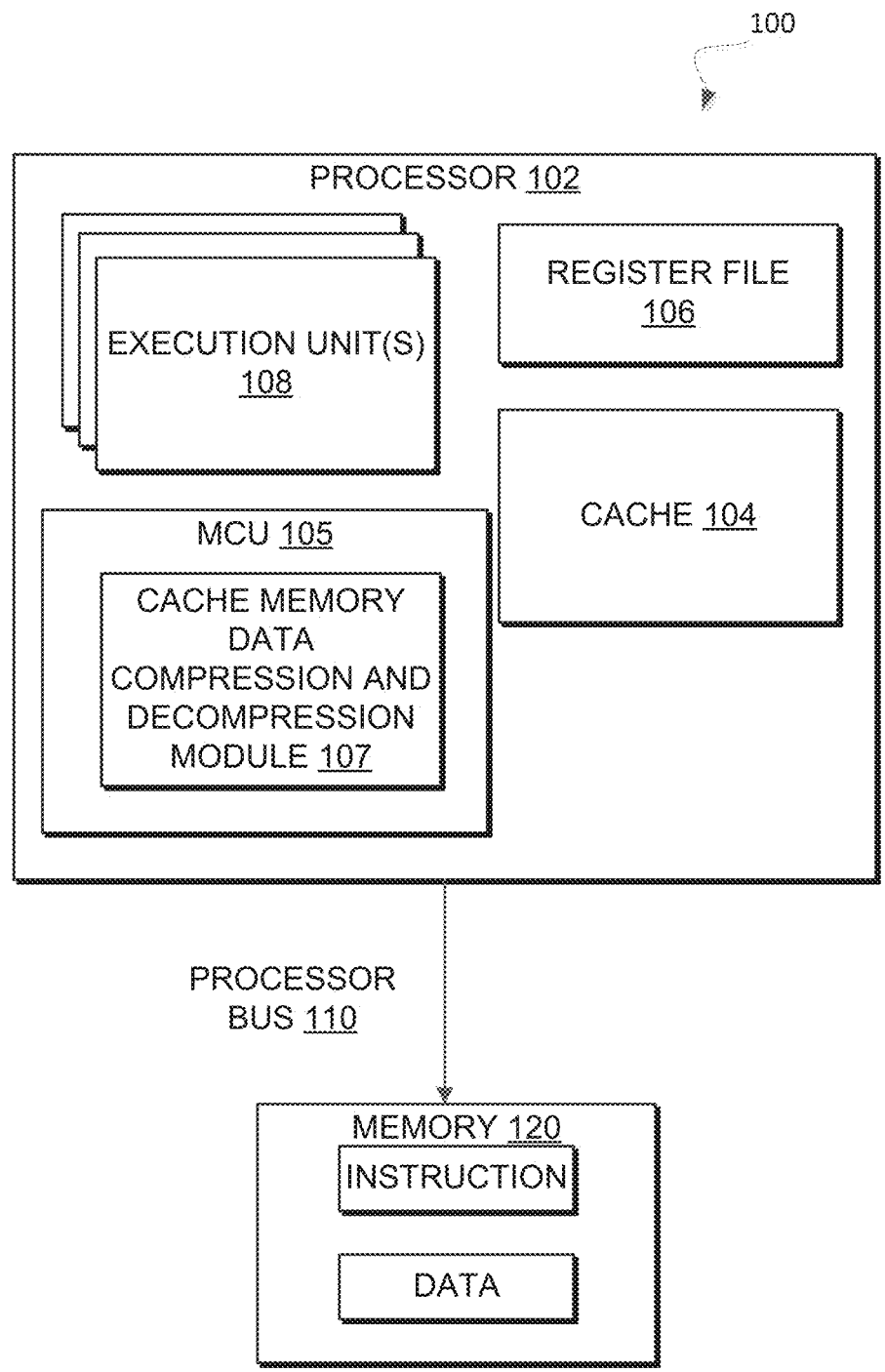
FIG. 1 is a block diagram illustrating a computing system that implements a memory controller unit (MCU) with a cache memory data compression and decompression module for compressing and/or decompressing data in accordance with some embodiments.

FIG. 1 is a block diagram illustrating a computing system 100 that implements a memory controller unit (MCU) 105 with a cache memory data compression and decompression module 107 for compressing and/or decompressing data in accordance with some embodiments. The computing system 100 is formed with a processor 102 that includes one or more execution units 108 to execute an instruction (e.g., a data block of a cache line as further described below) and the MCU 105 that implements one or more features in accordance with one or more embodiments as described herein. In short, the MCU 105 coordinates memory accesses to the main memory 120 and the cache memory 104 via one or more memory channels and the cache memory data compression and decompression module 107 coordinates the compressing and decompressing of data to and from the cache memory 104. For example, data retrieved from the main memory 120 may be compressed and then stored in the cache memory 104 and data retrieved from the cache memory 104 may be decompressed and then accessed or read by the processor 102. In some embodiments, the cache memory may not be located in the processor. For example, the processor may access a cache memory from an external location. Additional details with regard to the cache memory data compression and decompression module 107 are described in more detail below with respect to FIGS. 2-6.

Computing system 100 includes a component, such as a processor 102, to employ execution units 108 including logic to perform algorithms for processing data (e.g., cache memory data and/or main memory data) in accordance with the embodiments described herein. System 100 is representative of processing systems based on the PENTIUM III™, PENTIUM 4™, Xeon™, Itanium, XScale™ and/or StrongARM™ microprocessors available from Intel Corporation of Santa Clara, Calif., although other systems (including PCs having other microprocessors, engineering workstations, set-top boxes, and the like) may also be used. In one embodiment, sample computing system 100 executes a version of the WINDOWS™ operating system available from Microsoft Corporation of Redmond, Wash., although other operating systems (e.g., UNIX and Linux), embedded software, and/or graphical user interfaces may also be used. Thus, embodiments of the present disclosure are not limited to any specific combination of hardware circuitry and software.

Embodiments are not limited to computer systems. Alternative embodiments of the present disclosure can be used in other devices such as handheld devices and embedded applications. Examples of handheld devices include, but are not limited to, cellular phones, Internet Protocol devices, digital cameras, personal digital assistants (PDAs), and handheld PCs. Embedded applications may include, but are not limited to, a micro controller, a digital signal processor (DSP), system on a chip (SoC), network computers (NetPC), set-top boxes, network hubs, wide area network (WAN) switches, or any other system that can perform one or more instructions in accordance with at least one embodiment.

In the illustrated embodiment of FIG. 1, processor 102 includes one or more execution units 108 to implement an algorithm that is to perform at least one instruction. One embodiment may be described in the context of a single processor desktop or server system, but alternative embodiments may be included in a multiprocessor system. System 100 may be an example of a 'hub' system architecture. The computer system 100 includes a processor 102 to process data signals. The processor 102, as one illustrative example, includes a complex instruction set computer (CISC) microprocessor, a reduced instruction set computing (RISC) microprocessor, a very long instruction word (VLIW) microprocessor, a processor implementing a combination of instruction sets, or any other processor device, such as a digital signal processor, for example. The processor 102 is coupled to a processor bus 110 that transmits data signals between the processor 102 and other components in the system 100, such as main memory 120 storing instruction, data, or any combination thereof. The other components of the system 100 may include, but are not limited to, a graphics accelerator, a memory controller hub, an I/O controller hub, a wireless transceiver, a Flash BIOS, a network controller, an audio controller, a serial expansion port, and an I/O controller. These elements perform their conventional functions that are well known to those familiar with the art.

In one embodiment, the processor 102 includes a Level 1 (L1) internal cache memory 104. Depending on the architecture, the processor 102 may have a single internal cache memory or multiple levels of internal cache memories (e.g., L1 and L2). Other embodiments include a combination of both internal and external caches depending on the particular implementation and needs. Register file 106 is to store different types of data in various registers including, but not limited to, integer registers, floating point registers, vector registers, banked registers, shadow registers, checkpoint registers, status registers, configuration registers, and instruction pointer registers.

Execution unit 108, including logic to perform integer and floating point operations, also resides in the processor 102. It should be noted that the execution unit may or may not have a floating point unit. The processor 102, in one embodiment, includes a microcode (ucode) ROM to store microcode, which when executed, is to perform algorithms for certain macroinstructions or handle complex scenarios. Here, microcode is potentially updateable to handle logic bugs/fixes for processor 102.

Alternate embodiments of an execution unit 108 may also be used in micro controllers, embedded processors, graphics devices, DSPs, and other types of logic circuits. System 100 includes a main memory 120. Main memory 120 may include, but is not limited to, a dynamic random access memory (DRAM) device, a static random access memory (SRAM) device, flash memory device, or other memory device. Main memory 120 stores instructions and/or data represented by data signals that are to be executed by the processor 102. The processor 102 is coupled to the main memory 120 via a processor bus 110. A system logic chip, such as a memory controller hub (MCH) may be coupled to the processor bus 110 and main memory 120. An MCH can provide a high bandwidth memory path to memory 120 for instruction and data storage and for storage of graphics commands, data and textures. The MCH can be used to direct data signals between the processor 102, main memory 120, and other components in the system 100 and to bridge the data signals between processor bus 110, main memory 120, cache memory 104, and system I/O, for example. The MCH may be coupled to main memory 120 through a memory interface. In some embodiments, the system logic chip can provide a graphics port for coupling to a graphics controller through an Accelerated Graphics Port (AGP) interconnect. The system 100 may also include an I/O controller hub (ICH). The ICH can provide direct connections to some I/O devices via a local I/O bus. The local I/O bus is a high-speed I/O bus for connecting peripherals to the main memory 120, chipset, and processor 102. Some examples are the audio controller, firmware hub (flash BIOS), wireless transceiver, data storage, legacy I/O controller containing user input and keyboard interfaces, a serial expansion port such as Universal Serial Bus (USB), and a network controller. The data storage device can comprise a hard disk drive, a floppy disk drive, a CD-ROM device, a flash memory device, or other mass storage device.

For another embodiment of a system, the MCU 105 can be used with a system on a chip. One embodiment of a system on a chip includes a processor and a memory. The memory for one such system is a flash memory. The flash memory may be located on the same die as the processor and other system components. Additionally, other logic blocks, such as a memory controller or graphics controller, may also be located on a system on a chip.

Figure 2:
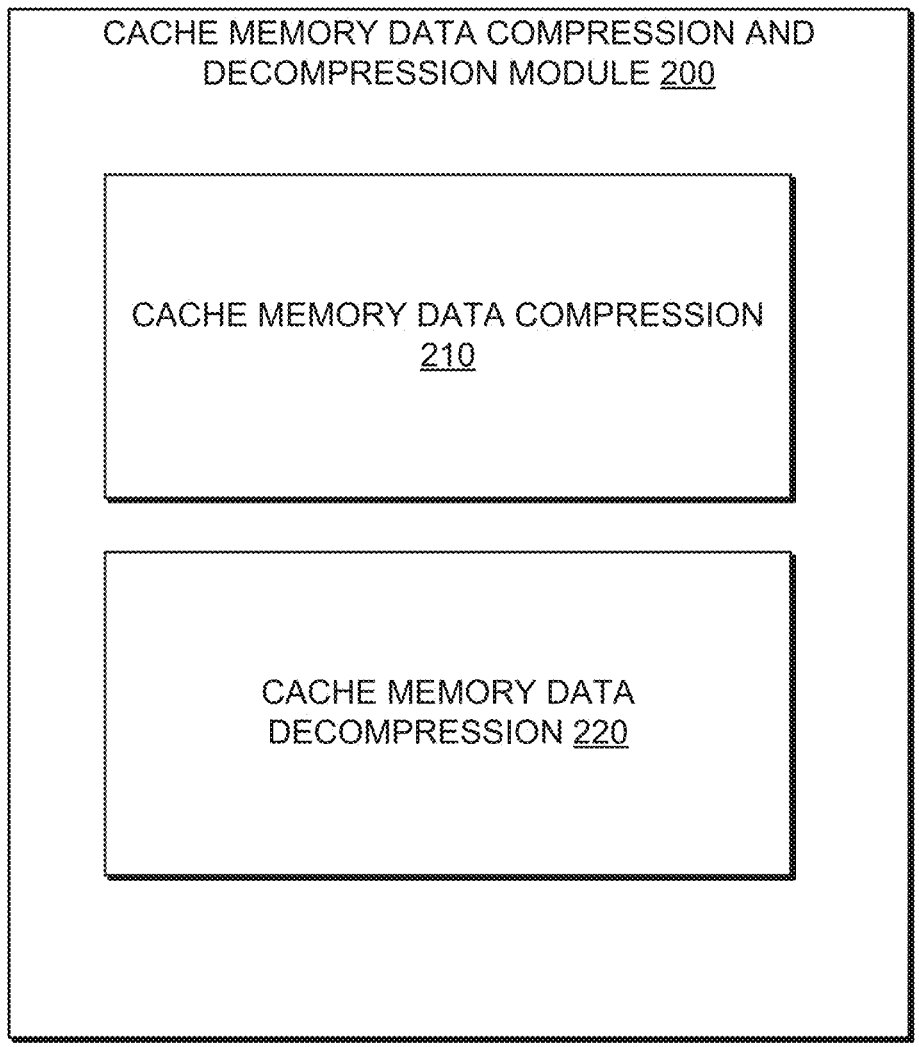
FIG. 2 is a block diagram illustrating a cache memory data compression and decompression module in accordance with some embodiments of the disclosure.

FIG. 2 is a block diagram illustrating an example cache memory data compression and decompression module 200 in accordance with some embodiments of the disclosure. The cache memory data compression and decompression module 200 may correspond to the cache memory data compression and decompression module 107 of FIG. 1. In general, the cache memory data compression and decompression module 200 may include a data compression sub-module (or function block) 210 and a data decompression sub-module (or function block) 220. In alternative embodiments, the functionality of one or more of the sub-modules may be combined or divided. For example, a single sub-module may perform the functionality of the data compression sub-module 210 and a data decompression module 220 or the functionality of each of the sub-modules 210 and 220 may be separated between multiple sub-modules.

As shown in FIG. 2, the cache memory data compression and decompression module 200 may include a data compression sub-module 210 and a data decompression sub-module 220. The data compression sub-module 210 may receive data from a main memory (e.g., main memory 120) and compress the received data. Further details with regard to a data compression algorithm are discussed with relation to FIG. 4. The data decompression sub-module 220 may receive compressed data from a cache memory (e.g., cache memory 104) and may decompress the received compressed data. Further details with regard to a data decompression algorithm are discussed with relation to FIG. 6.

Figure 3:
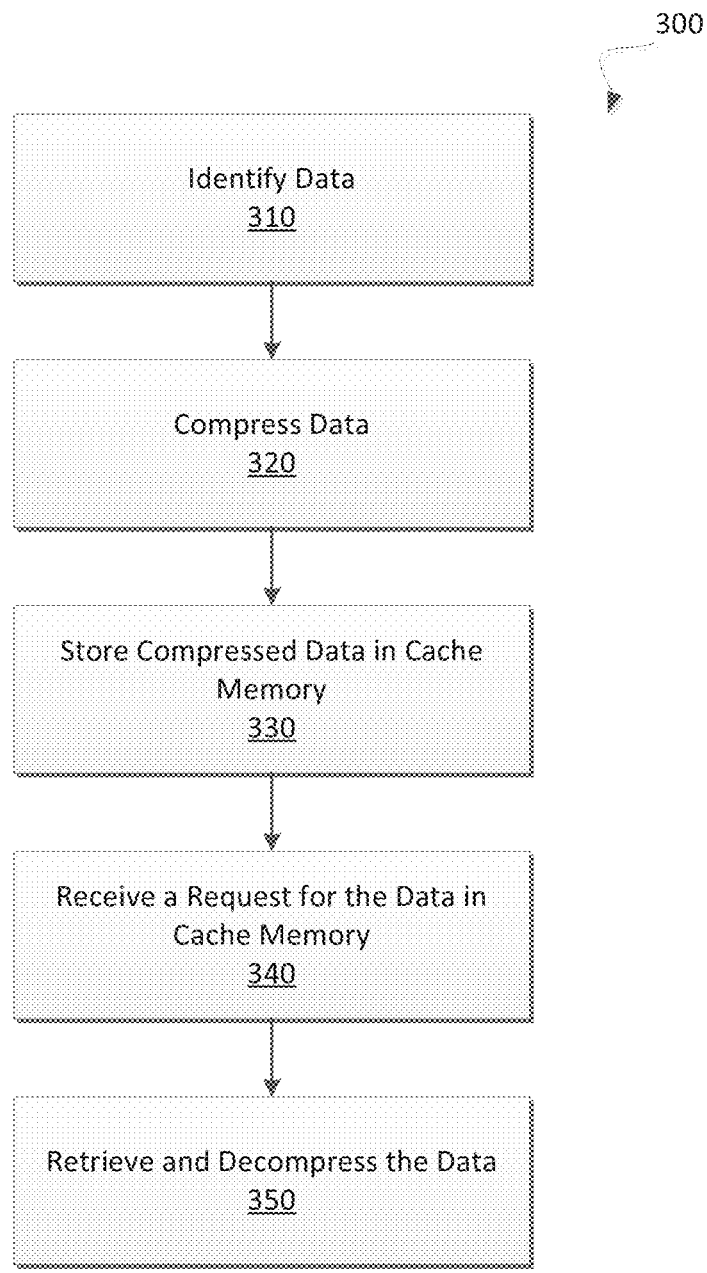
FIG. 3 is a flow diagram of a method to compress data to be stored in a cache memory and for decompressing the data that has been stored in the cache memory in accordance with some embodiments.

FIG. 3 is a flow diagram of an example method 300 to compress data received from a main memory and to be stored in a cache memory and to decompress the data that has been stored in the cache memory. In some embodiments, the method 300 may be performed by the cache memory data compression and decompression module 107 or 200. For example, the method 300 may be used by the cache memory data compression and decompression module 107 or 200 to compress data to be copied from the main memory 120 to the cache memory 104 and to decompress the data stored in the cache memory 104 in response to a cache hit (e.g., a read request of data that is stored in the cache memory) from the processor 102.

The method 300 may also be performed by processing logic that may comprise hardware (e.g., circuitry, dedicated logic, programmable logic, microcode, etc.), software (e.g., operations being performed by the MCU), firmware, or a combination thereof. In some embodiments, the method 300 may be performed by the MCU 105 of FIG. 1. Alternatively, other components of the computing system 100 may perform some or all of the operations of the method 300.

As shown in FIG. 3, the method 300 may begin with the processing logic identifying, at block 310, data to be stored in a cache memory device. In some embodiments, the identified data may be data that is associated with a recent read request. For example, a processor may issue a read request for data stored in a main memory. More frequently or more recently accessed data stored in the main memory may be identified to be copied from the main memory to be stored in the cache memory. The processing logic may compress the identified data received or identified in the main memory (block 320). In some embodiments, data compression may involve encoding data using fewer bits than the original data. For example, the bits of data may be reduced by identifying and eliminating redundancy in the data. A lossless data compression algorithm may be used to compress the identified data. In some embodiments, a lossless data compression algorithm may allow the original uncompressed data to be perfectly reconstructed from the compressed data. Further details with regard to a data compression algorithm are disclosed with relation to FIG. 4. The processing logic may store the compressed data in the cache memory (block 330). As such, the identified data to be copied from the main memory and stored in the cache memory may be compressed by the identification and elimination of redundant bits within the identified data. The processing logic may receive a request for the compressed data stored in the cache memory (block 340). For example, the processor may issue a read request for data and if the data is stored in the cache memory, then the data may be retrieved from the cache memory as opposed to the main memory. Such an event where data requested by the processor is currently stored in the cache memory may be termed a cache hit. In some embodiments, the MCU 105 or another component of the computing system 100 may identify the data associated with the read request from the processor. For example, when data is copied from main memory into the cache memory, a cache entry may be created by the MCU. The cache entry may include an identification of the copied data as well as the cache memory location for the requested data. When the processor issues a read request to data in the main memory, the processor and/or MCU may initially check for a corresponding cache entry in the cache memory. The MCU may check for the contents of the data in the requested memory location in the cache memory. If the processor or MCU finds that the memory location is in the cache memory, a cache hit has occurred and the data in the cache memory may be retrieved, decompressed, and read and/or operated upon by the processor. However, if the MCU does not find the memory location in the cache memory, a cache miss has occurred. In response to the cache miss, the MCU and/or the cache data compression and decompression module 107 may allocate a new cache entry, retrieve the data from the main memory, compress the requested data from the main memory, and store the compressed data in the cache memory. Furthermore, the uncompressed data may be operated upon and/or read by the processor.

Returning to FIG. 3, in response to the request for the data that has been compressed in the cache memory, the processing logic may retrieve and decompress the compressed data (block 350). Further details with regard to a data decompression algorithm are disclosed with relation to FIG. 6. A processor may then operate upon and/or read the uncompressed or decompressed data.

As such, as data is to be copied from a main memory and to be stored in the cache memory, the data may first be compressed and then subsequently stored in the cache memory. Furthermore, if the data corresponding to the compressed data is subject to a read request, the compressed data may first be decompressed and then subsequently read or operated upon by the processor issuing the read request. Thus, when the processor requires a read or access of data, the processor may first determine or check whether a copy of the needed data is in the cache memory. If so, the requested data in the cache memory may be uncompressed and the processor may access the required uncompressed data from the cache memory, which is much faster than reading and accessing data stored in the main memory.

Such a compression and decompression method may present several advantages to improve the overall performance of a processor or processor-based system. Advantages include, but are not limited to, an increase in the effective storage capacity of the cache memory without increasing the physical size of the cache memory. The increased effective storage capacity may allow an increased amount of data to be stored in the cache memory and thus increase the likelihood of a cache hit. As such, the processor performance may be increased by reducing the number of accesses of data stored in the main memory which generally has a longer latency and which may consume more power than an access of the same data (i.e., the compressed data) stored in the cache memory.

Figure 4:
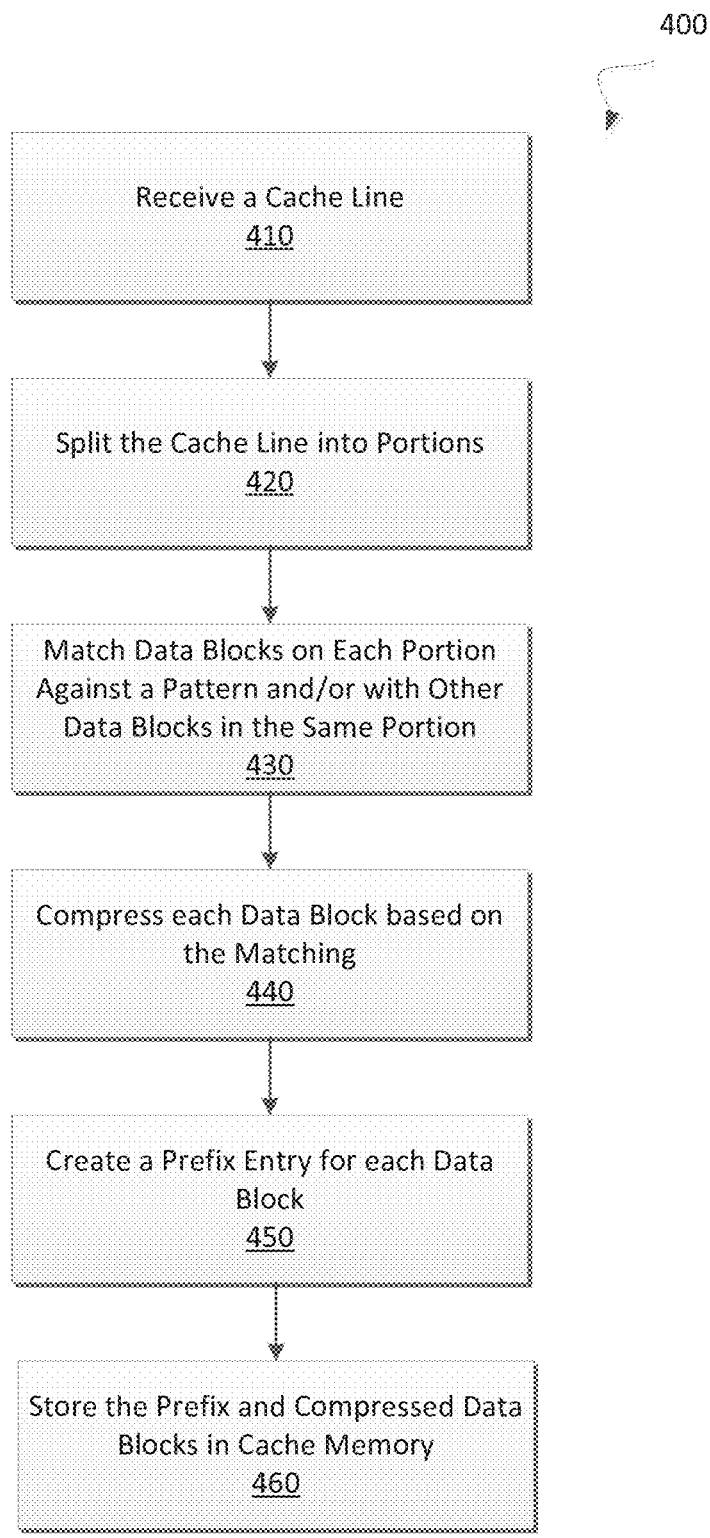
FIG. 4 is a flow diagram of a method to compress data to be stored in a cache memory in accordance with some embodiments.

FIG. 4 is a flow diagram of a method 400 to compress data to be stored in a cache memory in accordance with some embodiments. In general, the method 400 may be implemented by the cache memory data compression and decompression module 107 or 200. For example, the method 400 may be used by the cache data compression and decompression module 107 or 200 to compress a copy of data stored in the main memory 120 and to store the compressed copy of the data in the cache memory 104. In some embodiments, the compression of the data may be performed in response to a processor 102 accessing the data stored on the main memory 120. Alternatively, other components of the computing system 100 may perform some or all of the operations of the method 400.

The method 00 may also be performed by processing logic that may comprise hardware (e.g., circuitry, dedicated logic, programmable logic, microcode, etc.), software (e.g., operations being performed by the MCU), firmware, or a combination thereof. In some embodiments, the method 400 may be performed by the MCU 105 of FIG. 1. Alternatively, other components of the computing system 100 may perform some or all of the operations of the method 400.

As shown in FIG. 4, the method 400 may begin with the processing logic receiving a cache line (block 410). In some embodiments, data may be transferred between a main memory (e.g., main memory 120) and a cache memory (e.g., cache memory 104) in fixed data sizes referred to herein as a cache line. The cache line may include multiple data blocks. As such, a fixed size of data blocks that are currently stored in the main memory may be identified and/or received. Furthermore, the processing logic may separate or split the received cache line into at least two portions or sections (block 420). Each portion or section includes fewer data blocks than the entire cache line. For example, the cache line may be separated into a first half and a second half. Thus, half of the data blocks of the cache line may be included in the first half (i.e., a first half portion) of the cache line and another half of the data blocks of the cache line may be included in the second half (i.e., a second half portion) of the cache line. In some embodiments, each of the portions or sections that the cache line is split into includes an equal number of data blocks. However, in alternative embodiments, the cache line may be split into portions with different sizes of data blocks.

The data blocks of the cache line may each include a fixed size group of bits (and thus bytes) that are handled or operated on by a processor. Each of the data blocks may correspond to a natural unit of data used by a processor. For example, each data block may be handled or operated upon as a unit by an instruction set and/or hardware of a processor. Such a group of bits or natural units of data that is operated upon by a processor includes, but is not limited to, a halfword, word, doubleword, quadword, longword, octaword, or any other representation of data or fixed-size group of bits that is to be operated upon by a processor. Portions of the disclosure herein refer to a doubleword, but any other type of unit of data or type of data block may be used in such examples illustrated with a doubleword. The number of bits in in each data block may vary based on the processor. For example, the number of bits in a data block may be, but is not limited to, 8 bits, 16 bits, 24 bits, 32 bits, or 64 bits.

As such, the cache line may be split into two or more portions where each of the split portions includes one or more data blocks including a fixed size of bits (e.g., words or doublewords).

Referring back to FIG. 4, the processing logic may match each data block in each of the split portions of the cache line against a pattern and/or with other data blocks in the same portion (block 430). For example, content (e.g., bit or byte values) of each data block may be processed to identify if the group of bits within the data block matches and thus includes at least one predefined data bit or byte pattern (e.g., all 0 byte values, all 1 byte values, a byte repeated four times, etc.). In some embodiments, each of the data blocks may also be processed to identify if the content or a group of bits (or bytes) of one data block includes a similarity or redundancy to at least another group of bits of another data block within the same portion of the split cache line. Such identification of a similarity or redundancy to another data block within the same portion of the cache line may be limited to the two immediately prior data blocks. For example, if a portion of a cache line (e.g., a split portion) includes eight data blocks, the fourth data block may be processed to determine if it has any similarity or redundancy with the second data block and the third data block of the same portion of the cache line. However, the fourth data block may not be processed to determine if it has a similarity or redundancy with any other data block within the same portion of the cache line or any data block of another portion of the cache line. As such, the data blocks of each split portion of the cache line may be processed independently of each other. For example, no matching of a pattern between a data block of a first portion of the cache line may be performed with a data block of a second portion of the cache line. Examples of patterns are discussed in further detail below. Furthermore, the compressing of data blocks in each split portion may be performed over two clock cycles associated with a processor or processing device. For example, the data blocks of the first portion may be processed and compressed at a first cycle and the data blocks of the second portion may be processed and compressed at a second cycle after the first cycle. As such, the compression of the data blocks is performed on a per portion of the cache line basis.

The processing logic may compress the data blocks based on the matching of a group of bits or bytes of a data block to a pattern (block 440). For example, the size of a compressed data block may be based on which pattern is matched with the original (uncompressed) data block. In some embodiments, the compressed size of a compressed data block may be one of a plurality of compressed data bit sizes. For example, the sizes of the compressed data blocks may vary from, but are not limited to, 0 bits, 8 bits, 16 bits, and an uncompressed size of 32 bits. In some embodiments, such compressed bit sizes may be the only compressed sizes for compressed data blocks. Although the disclosure refers to specific compressed bit sizes and particular number of available bit sizes for compressed data blocks, any number of compressed sizes may be used to compress the data blocks that have been matched with at least one pattern. Further details with regard to example patterns that may be identified in a data block and the example compressed sizes are disclosed in further detail below.

As shown in FIG. 4, the processing logic may further create a prefix for each of the data blocks (block 450). For example, each compressed data block in each of the portions of the cache line may be assigned a prefix based on a type of pattern that matches each original (i.e., uncompressed) data block or if no pattern matches an original data block. Each of the prefixes may be an encoding of the matching pattern that is used to compress the corresponding original data block or an indication that the corresponding data block was not compressed (e.g., there was no pattern found to match the original data block). Furthermore, the processing logic may store the prefixes and the compressed data blocks for each portion of the cache line in the cache memory (block 460). Examples of the previously described data blocks, prefixes, and compressed data blocks are further described with respect to FIGS. 5A and 5B.

As such, a cache line may be received from a main memory. The cache line may be split into two or more portions. Each split portion of the cache line may include a plurality of data blocks. Each split portion may be independently compressed based on pattern matching of the data blocks with predefined bit or byte patterns as well as with redundancy with other data blocks within the same split portion of the cache line. In some embodiments, the pattern matching with other data blocks may be limited to the two prior data blocks. A data block may then be compressed based on the type of pattern that it matches or, if the data block does not match any type of pattern, then the data block may remain uncompressed. Each data block may also be assigned a prefix (i.e., encoding) based on the pattern that it matches or if it does not match any such pattern. The prefixes for each of the data blocks may be stored in the cache memory along with the compressed data blocks. The prefixes may include the encodings used to compress a data block.

Figure 5A:
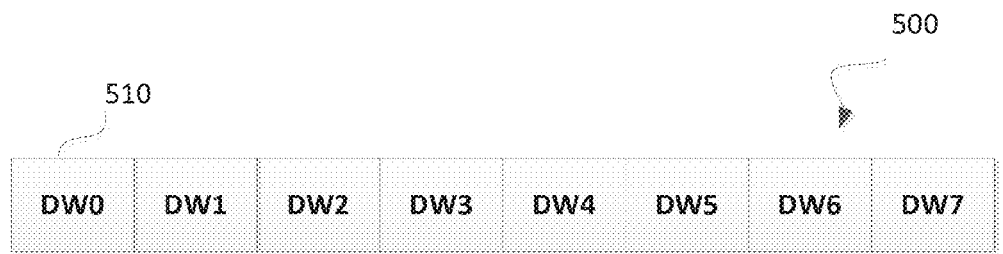
FIG. 5A illustrates a portion of a cache line in accordance with some embodiments of the disclosure.

FIG. 5A illustrates a portion 500 of a cache line in accordance with some embodiments. In general, the portion 500 may be part of a cache line of data to be copied from a main memory (e.g., main memory 120) to be compressed and stored in a cache memory (e.g., cache memory 104). The portion 500 may be retrieved by an MCU 105 of FIG. 1.

Figure 5B:
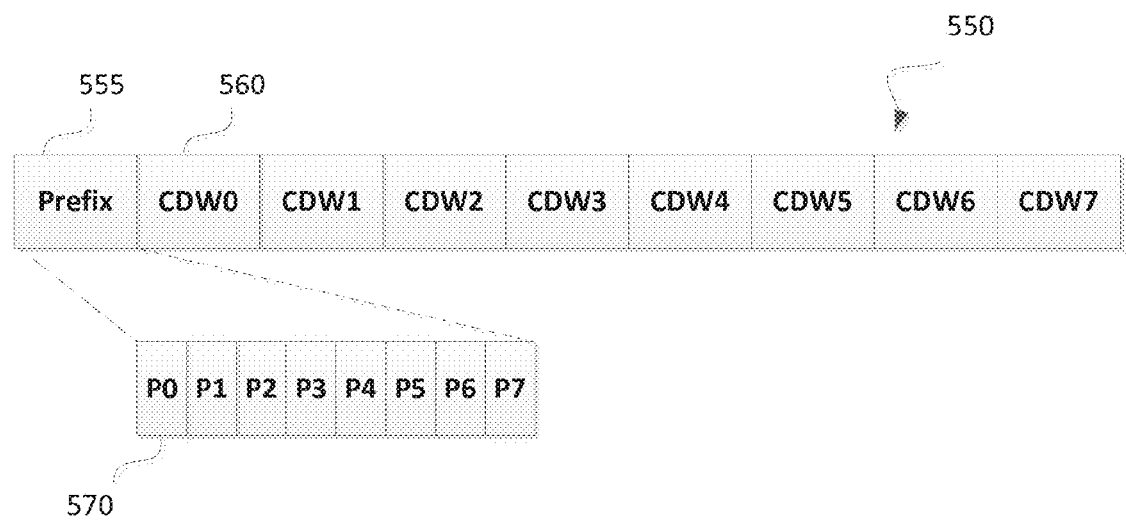
FIG. 5B illustrates a compressed portion of a cache line in accordance with some embodiments.

As shown in FIG. 5A, the portion 500 of the cache line may include a plurality of data blocks. For example, the portion 500 may include eight doublewords. Each of the data blocks of the portion 500 is uncompressed. For example, data block 510 (e.g., doubleword 0) may be uncompressed data currently stored in a main memory. FIG. 5B illustrates a compressed portion 550 of the cache line. The compressed portion 550 of the cache line may correspond to the portion 500 of the cache line after it has been compressed by a cache memory data compression and decompression module 107 or 200. As shown, the compressed portion 550 includes a prefix 555 and compressed data blocks. For example, data block 560 (e.g., doubleword 0) is a compressed version of the data block 510. The prefix field 555 may include multiple fields where each field includes an encoding (e.g., the assigned prefix) for each of the compressed or uncompressed data blocks of the compressed portion 550. For example, uncompressed data block 510 may be compressed to a compressed data block 560 and a prefix 570 may be assigned to the compressed data block 560 based on the pattern that the uncompressed data block 510 matched. The prefix 570 may then be used to decompress the compressed data block 560 back to the uncompressed data block 510.

As illustrated in FIGS. 5A and 5B, the portion of the cache line may include eight data blocks of doublewords and the prefix for the portion of the cache line may be a 4-byte prefix field that includes eight 4-bit encodings corresponding to the patterns that match the uncompressed data blocks and used to compress the corresponding compressed data blocks. The compressed (and uncompressed if no pattern is matched) data blocks may then follow the prefix.

Figure 6:
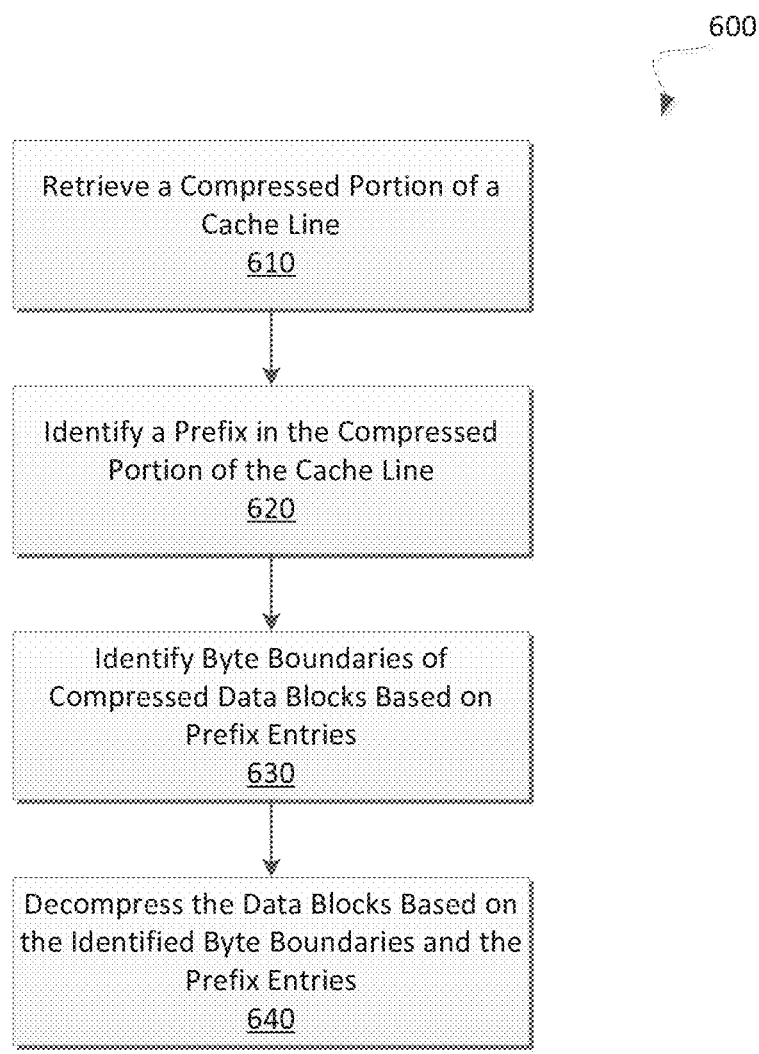
FIG. 6 is a flow diagram of a method to decompress data stored in a cache memory in accordance with some embodiments.

FIG. 6 is a flow diagram of an example method 600 to decompress data stored in a cache memory. In general, the method 600 may be implemented by the cache memory data compression and decompression module 107 or 200. For example, the method 600 may be used by the cache data compression and decompression module 107 or 200 to decompress a copy of data stored in the cache memory 104 in response to a cache hit. In some embodiments, the decompression of the data may be performed in response to a processor 102 issuing a read request for the data stored in the main memory 120 and an identification that the requested data is stored in the cache memory 104. Alternatively, other components of the computing system 100 may perform some or all of the operations of the method 600.

The method 600 may also be performed by processing logic that may comprise hardware (e.g., circuitry, dedicated logic, programmable logic, microcode, etc.), software (e.g., operations being performed by the MCU), firmware, or a combination thereof. In some embodiments, the method 400 may be performed by the MCU 105 of FIG. 1. Alternatively, other components of the computing system 100 may perform some or all of the operations of the method 400.

As shown in FIG. 6, the method 600 may begin with the processing logic retrieving a compressed cache line (block 610). For example, the compressed cache line may include two or more independently compressed portions or sections that each includes at least one compressed data block. The compressed cache line may be retrieved from the cache memory in response to a cache hit corresponding to data that is included in the compressed cache line. The processing logic may identify the prefix in the compressed portions of the cache line (block 620). For example, the prefix may be a fixed size field at the start of a compressed portion of a cache line followed by one or more compressed or uncompressed data blocks. In some embodiments, the prefix may be a 4-byte field at the start of a compressed portion of the cache line. As such, the prefix may be identified by locating a fixed size portion at the start of a compressed portion of a cache line. The processing logic may further identify byte boundaries of compressed data blocks based on prefix entries of the identified prefix (block 630). For example, the value of each prefix entry may correspond to a compressed size for a data block of the compressed portion of the cache line. If the compressed size for a compressed data block is known then the start and the end of the compressed data block may be identified.

As an example, a compressed portion of a cache line may include eight compressed and/or uncompressed doublewords. The prefix may be 32 bits in size (i.e., a total of 4-bytes with 4 bits assigned to each doubleword). As previously described, the prefix may be located at the start of the compressed portion of the cache line. Thus, the first 32 bits of the compressed portion of the cache line may be identified as the prefix. Each of the prefix entries (e.g., groups of 4 bits) may indicate the encoding or pattern that is matched with each uncompressed doubleword and thus indicates the resulting compressed size of the corresponding compressed doubleword. For example, if the first prefix entry for a first doubleword (e.g., doubleword 0) indicates that the compressed size of the corresponding compressed doubleword is 8 bits in size, then the first 8 bits after the prefix are the first compressed doubleword. Furthermore, if the second prefix entry for a second doubleword indicates that the compressed size of the corresponding compressed doubleword is 16 bits in size, then the following 16 bits (e.g., after the 32 bits of the prefix and the 8 bits of the first compressed doubleword) are the second compressed doubleword. Such a progression through the prefix entries may be used to identify the start and end of each compressed (or uncompressed) doubleword in the compressed portion of the cache line. As a result of using the prefix entries to identify the compressed sizes of the data blocks, the boundaries (i.e., starts and ends) of each of the data blocks may be identified in parallel, effectively allowing for the decompression of the compressed data blocks to be performed in parallel, thereby resulting in a lower latency for the decompression algorithm.

Returning to FIG. 6, the processing logic may then decompress the data blocks based on the identified byte boundaries and prefix entries as earlier described (block 640).

As such, a portion of a cache line may be decompressed based on prefix entries that correspond to each data block of the portion of the cache line. The prefix entries may indicate the encoding or pattern that was used to compress a data block. In some embodiments, the prefix entries may be used to identify the start and end of each compressed (or uncompressed) data block in the compressed portion of the cache line. Further details with regard to example prefixes, patterns, compressed formats, and compressed sizes of data blocks are described in further detail below.

As previously disclosed, a prefix may be assigned or generated to a data block based on a pattern that the data block matches. The prefix may be an encoding of the pattern used to compress the corresponding data block. Example patterns (arranged from most significant bit to least significant bit) that result in a compressed data block of a compressed size of 0 bits include, but are not limited to, the examples of the table below. One skilled in the art will recognize that any combination of patterns, prefixes, compressed formats, and/or compressed sizes may be used to compress and/or decompress cache memory data as described in the embodiments herein.

| Pattern | Description | Prefix | Compressed Format | Compressed Size (Bits) |
|---|---|---|---|---|
| zzzz | All-zero data block | 0000 | No data | 0 |
| 1111 | All "FF" data block | 0001 | No data | 0 |
| mmmm(0) | Complete match with the previous data block | 0010 | No data | 0 |
| mmmm(1) | Complete match with the data block before the previous data block | 0011 | No data | 0 |

As shown, if the content of a data block, such as a doubleword, is all zero bytes or is all one value bytes, the compressed size of the data block may be 0 bits. Furthermore, if a data block completely matches with the immediately prior data block or with the data block before the prior data block (i.e., the two prior data blocks), then the compressed size of the doubleword may also be 0 bits. As such, a data block (e.g., a doubleword) may be compressed to 0 bits and effectively contain no data if the data block includes all 0 bits, all 1 bits, or if the data block is a complete match (i.e., a copy) of the previous data block or the data block before the previous data block (i.e., if the data block is a complete copy of either of the two previous data blocks).

Example patterns that result in a compressed data block of a compressed size of 8 bits include, but are not limited to, the examples of the table below. These are merely examples and one skilled in the art will recognize that any combination of patterns, prefixes, compressed formats, and/or compressed sizes may be used to compress and/or decompress cache memory data as described in the embodiments herein.

| Pattern | Description | Prefix | Compressed Format | Compressed Size (Bits) |
|---|---|---|---|---|
| zzzx | Three zero bytes followed by a non-zero byte | 0100 | x (non-zero byte) | 8 |
| xzzz | Three zero bytes preceded by a non-zero byte | 0101 | x (non-zero byte) | 8 |
| rrrr | A byte "r" repeated four times | 0110 | r (any of the four bytes) | 8 |
| mmmx(0) | Partial match (first three bytes) with previous data block | 0111 | x (non-matching byte) | 8 |
| mmmx(1) | Partial match (first three bytes) with data block before previous data block | 1000 | x (non-matching byte) | 8 |

As shown in the table above, data blocks may be matched to various patterns resulting in a compressed data block size of 8 bits. For example, three 0 bytes followed by a non-zero byte, or three zero bytes preceded by a non-zero byte, a particular byte repeated four times, or partial matches (e.g., first three bytes with the previous data block or the data block before the previous data block) may result in the compression of the data block to 8 bits.

Example patterns that result in a compressed data block of a compressed size of 16 bits include, but are not limited to, the examples of the table below. These are again merely examples and any combination of patterns, prefixes, compressed formats, and/or compressed sizes may be used to compress and/or decompress cache memory data as described in the embodiments herein.

| Pattern | Description | Prefix | Compressed Format | Compressed Size (Bits) |
|---|---|---|---|---|
| zzxx | Two zero bytes followed by two non-zero bytes | 1001 | xx (two non-zero bytes) | 16 |
| zxzx | A repeated pattern of a zero byte followed by a non-zero byte | 1010 | xx (two non-zero bytes) | 16 |
| 11xx | Two '1' bytes followed by two different bytes | 1011 | xx (two non-1 bytes) | 16 |
| xxzz | Two non-zero bytes followed by two zero bytes | 1100 | xx (two non-zero bytes) | 16 |
| mmxx(0) | Partial match (first two bytes) with previous data block | 1101 | xx (two non-matching bytes) | 16 |
| mmxx(1) | Partial match (first two bytes) with data block before previous data block | 1110 | xx (two non-matching bytes) | 16 |

As shown in the table above, data blocks may be matched to various patterns resulting in a compressed data block size of 16 bits. For example, partial matches or redundancies involving two bytes may be identified in or between data blocks and result in the compression of the data block to 16 bits. Furthermore, a data block may remain compressed if no match is identified. For example, the prefix for an uncompressed data block may be '1111', the compressed format may thus be the original data block, and the size may be 32 bits.

As described above, a unique prefix may be assigned to each pattern that a data block may match and the compressed format of the data block. In some embodiments, a data block may be identified as matching two or more of the patterns. For example, a data block may be a complete match with the prior data block as well as a partial match with the data block before the prior data block. In such a case, the data block may be compressed according to the pattern that results in the smallest compressed size. In the above example, the data block may be compressed with the pattern corresponding to the complete match as opposed to the pattern corresponding with the partial match as the data block may be compressed to a smaller size with the pattern corresponding to a complete match.

Figure 7:
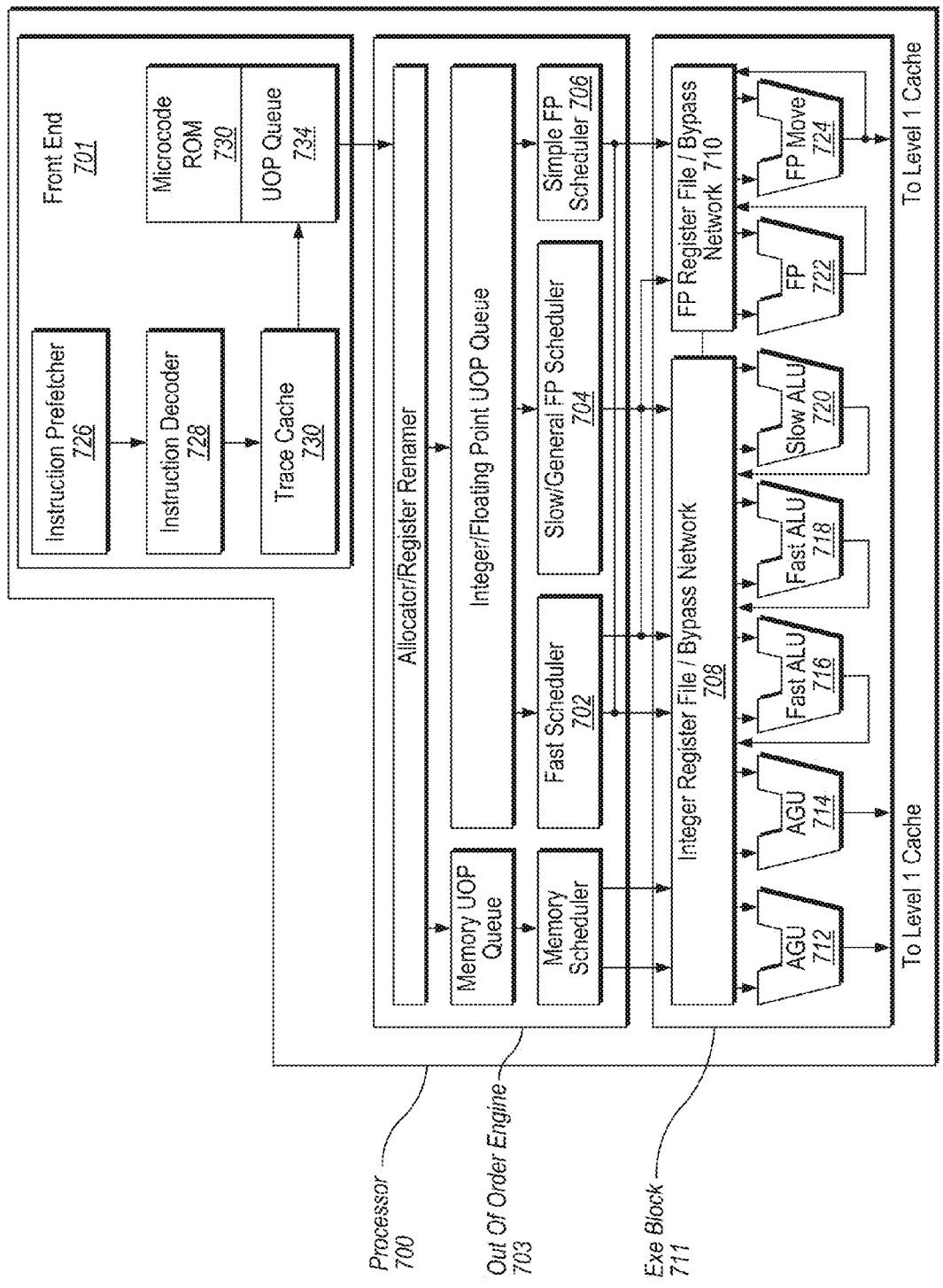
FIG. 7 illustrates a block diagram of the micro-architecture for a processor that includes logic circuits to perform cache memory data compression and decompression according to one embodiment.

FIG. 7 illustrates a block diagram of the micro-architecture for a processor 700 that includes logic circuits to perform cache memory data compression and decompression according to one embodiment. The cache memory data compression and decompression module 107 and 200 may be implemented in the processor 700. In some embodiments, an instruction in accordance with one embodiment can be implemented to operate on data elements having sizes of byte, word, doubleword, quadword, etc., as well as data types, such as single and double precision integer and floating point data types. In one embodiment the in order front end 701 is the part of the processor 700 that fetches instructions to be executed and prepares them to be used later in the processor pipeline.

The front end 701 may include several units. In one embodiment, the instruction prefetcher 716 fetches instructions from memory and feeds them to an instruction decoder 718 which in turn decodes or interprets them. For example, in one embodiment, the decoder decodes a received instruction into one or more operations called "micro-instructions" or "micro-operations" (also called micro op or uops) that the machine can execute. In other embodiments, the decoder parses the instruction into an opcode and corresponding data and control fields that are used by the micro-architecture to perform operations in accordance with one embodiment. In one embodiment, the trace cache 730 takes decoded uops and assembles them into program ordered sequences or traces in the uop queue 734 for execution. When the trace cache 730 encounters a complex instruction, the microcode ROM 732 provides the uops needed to complete the operation.

Some instructions are converted into a single micro-op, whereas others need several micro-ops to complete the full operation. In one embodiment, if more than four micro-ops are needed to complete an instruction, the decoder 718 accesses the microcode ROM 732 to do the instruction. For one embodiment, an instruction can be decoded into a small number of micro ops for processing at the instruction decoder 718. In another embodiment, an instruction can be stored within the microcode ROM 732 should a number of micro-ops be needed to accomplish the operation. The trace cache 730 refers to an entry point programmable logic array (PLA) to determine a correct micro-instruction pointer for reading the micro-code sequences to complete one or more instructions in accordance with one embodiment from the microcode ROM 732. After the microcode ROM 732 finishes sequencing micro-ops for an instruction, the front end 701 of the machine resumes fetching micro-ops from the trace cache 730.

The out-of-order execution engine 703 is where the instructions are prepared for execution. The out-of-order execution logic has a number of buffers to smooth out and re-order the flow of instructions to optimize performance as they go down the pipeline and get scheduled for execution. The allocator logic allocates the machine buffers and resources that each uop needs in order to execute. The register renaming logic renames logic registers onto entries in a register file. The allocator also allocates an entry for each uop in one of the two uop queues, one for memory operations and one for non-memory operations, in front of the instruction schedulers: memory scheduler, fast scheduler 702, slow/general floating point scheduler 704, and simple floating point scheduler 706. The uop schedulers 702, 704, 706, determine when a uop is ready to execute based on the readiness of their dependent input register operand sources and the availability of the execution resources the uops need to complete their operation. The fast scheduler 702 of one embodiment can schedule on each half of the main clock cycle while the other schedulers can only schedule once per main processor clock cycle. The schedulers arbitrate for the dispatch ports to schedule uops for execution.

Register files 708, 710, sit between the schedulers 702, 704, 706, and the execution units 712, 714, 716, 718, 710, 712, 714 in the execution block 711. There is a separate register file 708, 710, for integer and floating point operations, respectively. Each register file 708, 710, of one embodiment also includes a bypass network that can bypass or forward just completed results that have not yet been written into the register file to new dependent uops. The integer register file 708 and the floating point register file 710 are also capable of communicating data with the other. For one embodiment, the integer register file 708 is split into two separate register files, one register file for the low order 32 bits of data and a second register file for the high order 32 bits of data. The floating point register file 710 of one embodiment has 128 bit wide entries because floating point instructions typically have operands from 64 to 128 bits in width.

The execution block 711 contains the execution units 712, 714, 716, 718, 710, 712, 714, where the instructions are actually executed. This section includes the register files 708, 710, that store the integer and floating point data operand values that the micro-instructions need to execute. The processor 700 of one embodiment is comprised of a number of execution units: address generation unit (AGU) 712, AGU 714, fast ALU 716, fast ALU 718, slow ALU 710, floating point ALU 712, floating point move unit 714. For one embodiment, the floating point execution blocks 712, 714, execute floating point, MMX, SIMD, and SSE, or other operations. The floating point ALU 712 of one embodiment includes a 64 bit by 64 bit floating point divider to execute divide, square root, and remainder micro-ops. For embodiments of the present disclosure, instructions involving a floating point value may be handled with the floating point hardware.

In one embodiment, the ALU operations go to the high-speed ALU execution units 716, 718. The fast ALUs 716, 718, of one embodiment can execute fast operations with an effective latency of half a clock cycle. For one embodiment, most complex integer operations go to the slow ALU 710 as the slow ALU 710 includes integer execution hardware for long latency type of operations, such as a multiplier, shifts, flag logic, and branch processing. Memory load/store operations are executed by the AGUs 712, 714. For one embodiment, the integer ALUs 716, 718, 710, are described in the context of performing integer operations on 64 bit data operands. In alternative embodiments, the ALUs 716, 718, 710, can be implemented to support a variety of data bits including 16, 32, 128, 256, etc. Similarly, the floating point units 712, 714, can be implemented to support a range of operands having bits of various widths. For one embodiment, the floating point units 712, 714, can operate on 128 bits wide packed data operands in conjunction with SIMD and multimedia instructions.

In one embodiment, the uops schedulers 702, 704, 706, dispatch dependent operations before the parent load has finished executing. As uops are speculatively scheduled and executed in processor 700, the processor 700 also includes logic to handle memory misses. If a data load misses in the data cache, there can be dependent operations in flight in the pipeline that have left the scheduler with temporarily incorrect data. A replay mechanism tracks and re-executes instructions that use incorrect data. Only the dependent operations need to be replayed and the independent ones are allowed to complete. The schedulers and replay mechanism of one embodiment of a processor are also designed to catch instruction sequences for text string comparison operations.

The processor 700 also includes logic to implement cache memory data compression and decompression according to one embodiment. In one embodiment, the execution block 711 of processor 700 may include MCU 115, to perform cache memory data compression and decompression according to the description herein.

The term "registers" may refer to the on-board processor storage locations that are used as part of instructions to identify operands. In other words, registers may be those that are usable from the outside of the processor (from a programmer's perspective). However, the registers of an embodiment should not be limited in meaning to a particular type of circuit. Rather, a register of an embodiment is capable of storing and providing data, and performing the functions described herein. The registers described herein can be implemented by circuitry within a processor using any number of different techniques, such as dedicated physical registers, dynamically allocated physical registers using register renaming, combinations of dedicated and dynamically allocated physical registers, etc. In one embodiment, integer registers store thirty-two bit integer data. A register file of one embodiment also contains eight multimedia SIMD registers for packed data.

For the discussions herein, the registers are understood to be data registers designed to hold packed data, such as 64 bits wide MMX™ registers (also referred to as 'mm' registers in some instances) in microprocessors enabled with MMX technology from Intel Corporation of Santa Clara, Calif. These MMX registers, available in both integer and floating point forms, can operate with packed data elements that accompany SIMD and SSE instructions. Similarly, 128 bits wide XMM registers relating to SSE2, SSE3, SSE4, or beyond (referred to generically as "SSEx") technology can also be used to hold such packed data operands. In one embodiment, in storing packed data and integer data, the registers do not need to differentiate between the two data types. In one embodiment, integer and floating point are either contained in the same register file or different register files. Furthermore, in one embodiment, floating point and integer data may be stored in different registers or the same registers.

Figure 8:
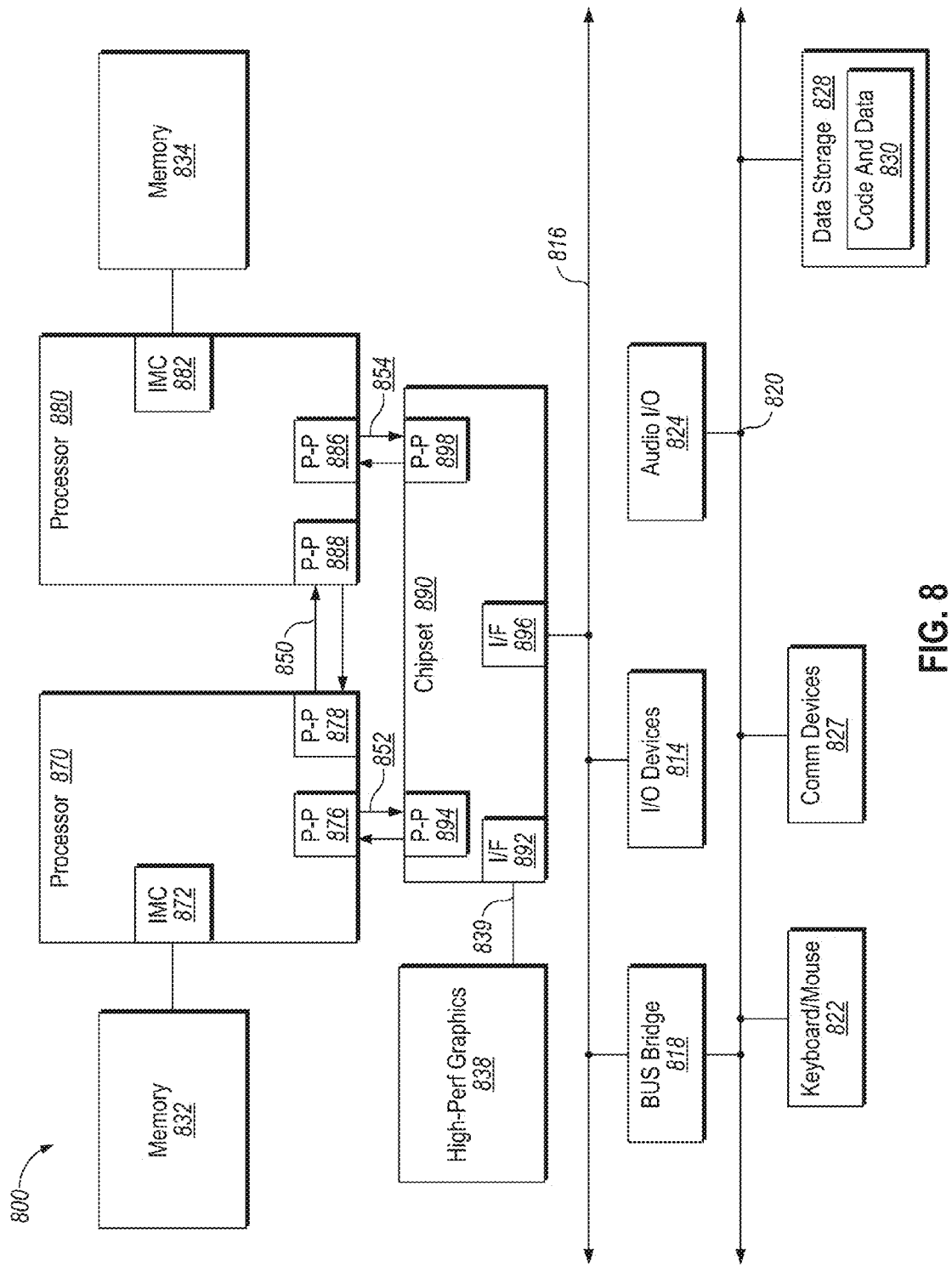
FIG. 8 is a block diagram of a computer system according to one implementation.

Embodiments may be implemented in many different system types. Referring now to FIG. 8, shown is a block diagram of a multiprocessor system 800 in accordance with an implementation. As shown in FIG. 8, multiprocessor system 800 is a point-to-point interconnect system, and includes a first processor 870 and a second processor 880 coupled via a point-to-point interconnect 850. As shown in FIG. 8, each of processors 870 and 880 may be multicore processors, including first and second processor cores (i.e., processor cores 874a and 874b and processor cores 884a and 884b), although potentially many more cores may be present in the processors. The processors each may include hybrid write mode logics in accordance with an embodiment of the present. In some embodiments, the cache memory data compression and decompression module 107 and 200 may be implemented in the multiprocessor system 800. For example, the cache memory data compression and decompression module 107 and 200 may be implemented in the processor 870 and/or the processor 880.

While shown with two processors 870, 880, it is to be understood that the scope of the present disclosure is not so limited. In other implementations, one or more additional processors may be present in a given processor.

Processors 870 and 880 are shown including integrated memory controller units 882 and 882, respectively. Processor 870 also includes as part of its bus controller units point-to-point (P-P) interfaces 876 and 888; similarly, second processor 880 includes P-P interfaces 886 and 888. Processors 870, 880 may exchange information via a point-to-point (P-P) interface 850 using P-P interface circuits 888, 888. As shown in FIG. 8, IMCs 882 and 882 couple the processors to respective memories, namely a memory 832 and a memory 834, which may be portions of main memory locally attached to the respective processors.

Processors 870, 880 may each exchange information with a chipset 890 via individual P-P interfaces 852, 854 using point to point interface circuits 876, 894, 886, 898. Chipset 890 may also exchange information with a high-performance graphics circuit 838 via a high-performance graphics interface 839.

A shared cache (not shown) may be included in either processor or outside of both processors, yet connected with the processors via P-P interconnect, such that either or both processors' local cache information may be stored in the shared cache if a processor is placed into a low power mode.

Chipset 890 may be coupled to a first bus 816 via an interface 896. In one embodiment, first bus 816 may be a Peripheral Component Interconnect (PCI) bus, or a bus such as a PCI Express bus or another third generation I/O interconnect bus, although the scope of the present disclosure is not so limited.

As shown in FIG. 8, various I/O devices 814 may be coupled to first bus 816, along with a bus bridge 818 which couples first bus 816 to a second bus 820. In one embodiment, second bus 820 may be a low pin count (LPC) bus. Various devices may be coupled to second bus 820 including, for example, a keyboard and/or mouse 822, communication devices 827 and a storage unit 828 such as a disk drive or other mass storage device which may include instructions/code and data 830, in one embodiment. Further, an audio I/O 824 may be coupled to second bus 820. Note that other architectures are possible. For example, instead of the point-to-point architecture of FIG. 8, a system may implement a multi-drop bus or other such architecture.

Figure 9:
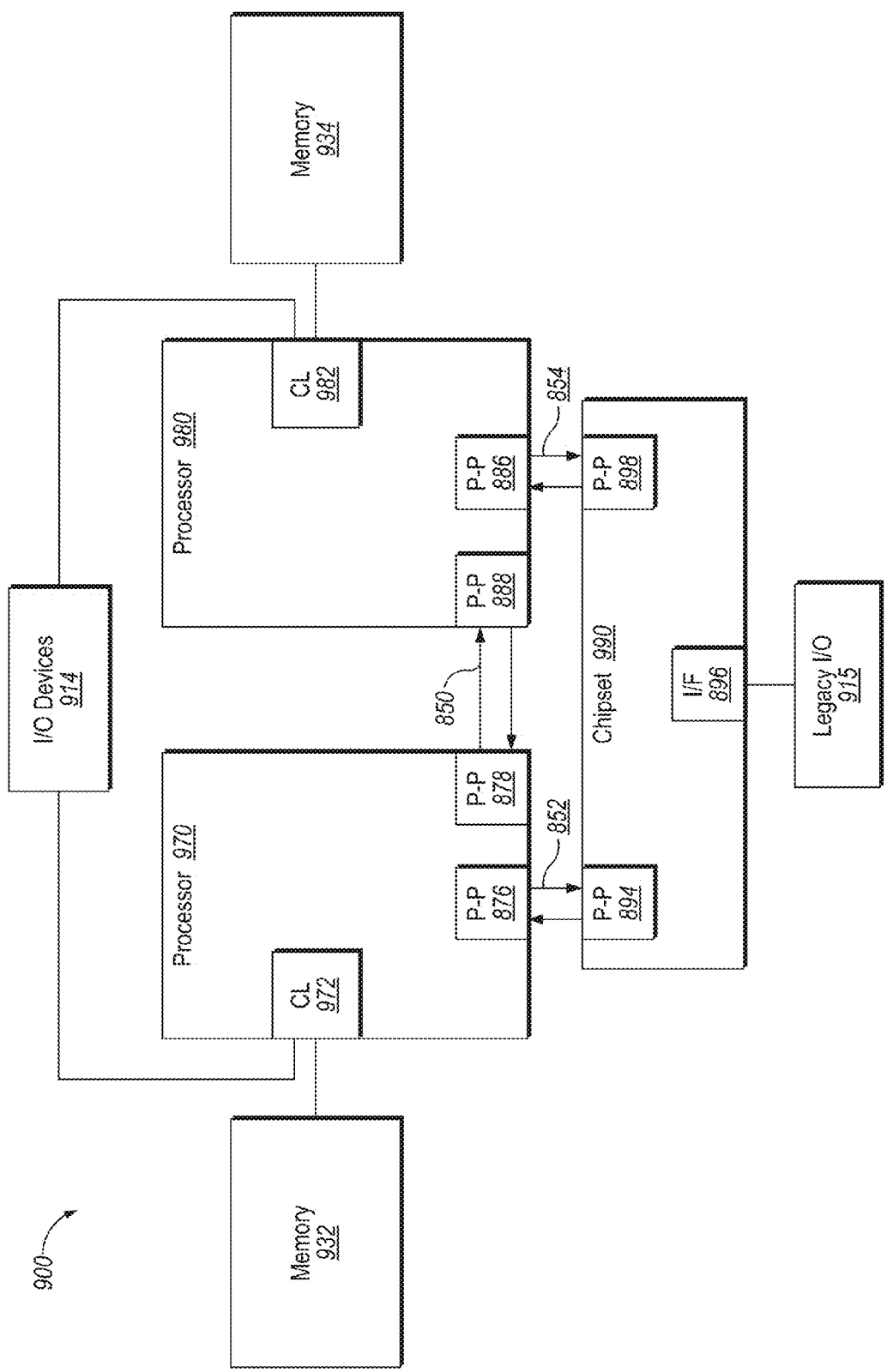
FIG. 9 is a block diagram of a computer system according to another implementation.

Referring now to FIG. 9, shown is a block diagram of a third system 900 in accordance with an embodiment of the present disclosure. Like elements in FIGS. 8 and 9 bear like reference numerals, and certain aspects of FIG. 8 have been omitted from FIG. 9 in order to avoid obscuring other aspects of FIG. 9.

FIG. 9 illustrates that the processors 970, 980 may include integrated memory and I/O control logic ("CL") 972 and 982, respectively. For at least one embodiment, the CL 972, 982 may include integrated memory controller units such as described herein. In addition. CL 972, 982 may also include I/O control logic. FIG. 9 illustrates that the memories 932, 934 are coupled to the CL 972, 982, and that I/O devices 915 are also coupled to the control logic 972, 982. Legacy I/O devices 915 are coupled to the chipset 990. In some embodiments, the cache memory data compression and decompression module 107 and 200 may be implemented in the system 900. For example, the cache memory data compression and decompression module 107 and 200 may be implemented in the processor 970 and/or the processor 980.

Figure 10:
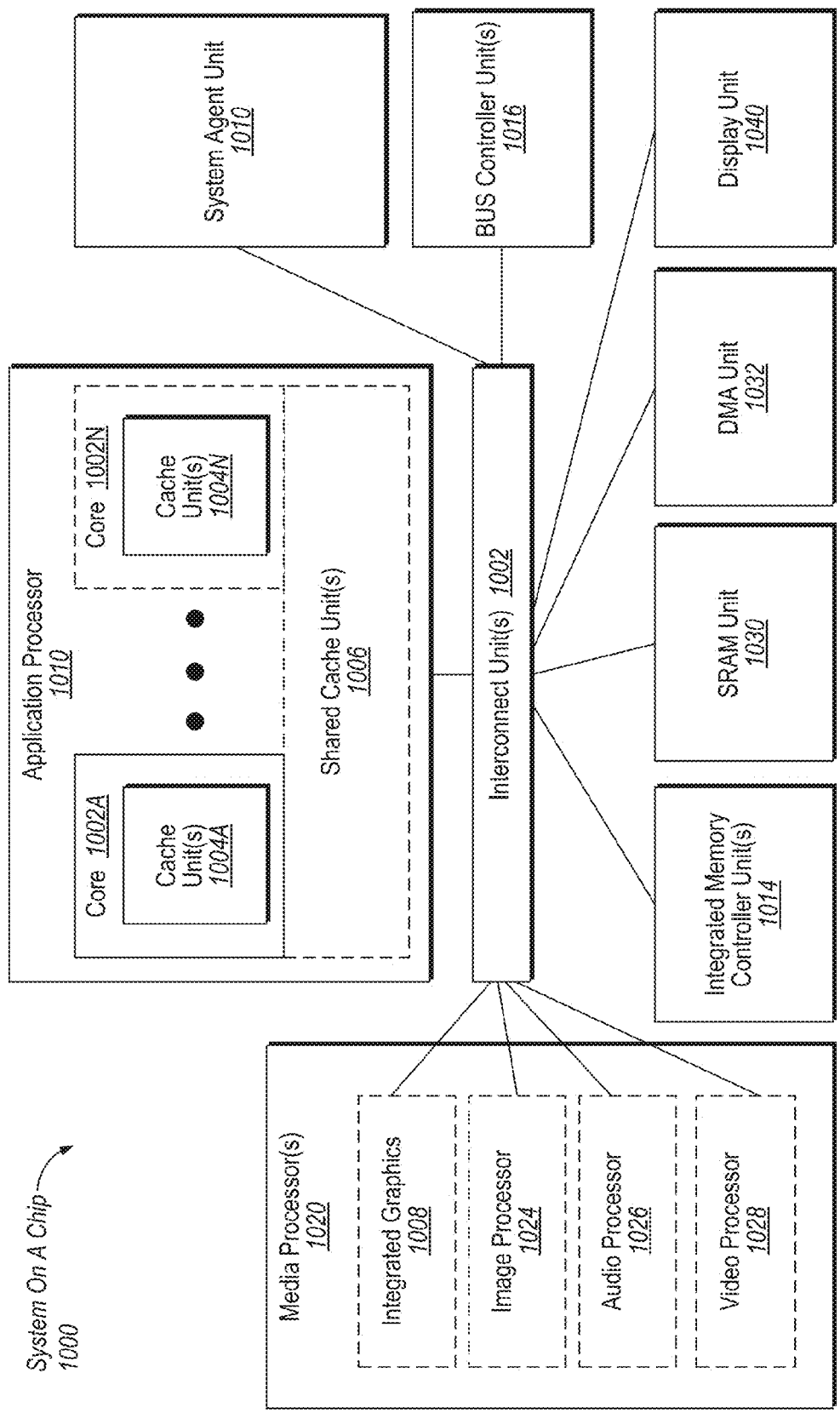
FIG. 10 is a block diagram of a system-on-a-chip according to one implementation.

FIG. 10 is an exemplary system on a chip (SoC) that may include one or more of the cores 1002. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Referring now to FIG. 10, shown is a block diagram of a SoC 1000 in accordance with an embodiment of the present disclosure. Similar elements in FIG. 5 bear like reference numerals. Also, dashed lined boxes are features on more advanced SoCs. In FIG. 10, an interconnect unit(s) 1002 is coupled to: an application processor 1010 which includes a set of one or more cores 1002A-N and shared cache unit(s) 1006; a system agent unit 1010; a bus controller unit(s) 1016; an integrated memory controller unit(s) 1014; a set or one or more media processors 1020 which may include integrated graphics logic 1008, an image processor 1024 for providing still and/or video camera functionality, an audio processor 1026 for providing hardware audio acceleration, and a video processor 1028 for providing video encode/decode acceleration; a static random access memory (SRAM) unit 1030; a direct memory access (DMA) unit 1032; and a display unit 1040 for coupling to one or more external displays. In some embodiments, the cache memory data compression and decompression module 107 and 200 may be implemented in the SoC 1000. For example, the cache memory data compression and decompression module 107 and 200 may be implemented in the application processor 1010 and/or cores 1002A-N.

Figure 11:
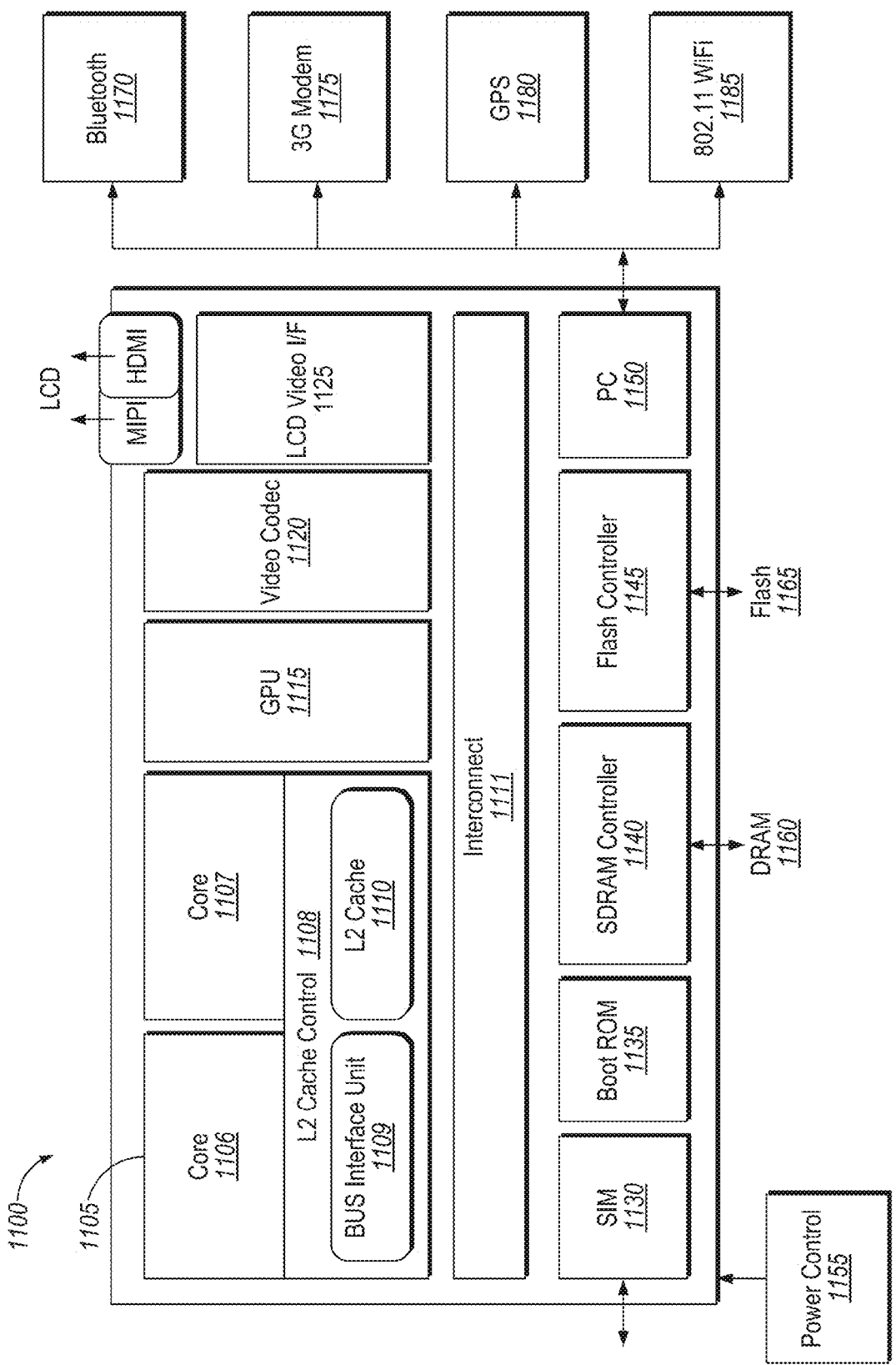
FIG. 11 illustrates another implementation of a block diagram for a computing system.

Turning next to FIG. 11, an embodiment of a system on-chip (SOC) design in accordance with embodiments of the disclosure is depicted. As an illustrative example, SOC 1100 is included in user equipment (UE). In one embodiment, UE refers to any device to be used by an end-user to communicate, such as a hand-held phone, smartphone, tablet, ultra-thin notebook, notebook with broadband adapter, or any other similar communication device. A UE may connect to a base station or node, which can correspond in nature to a mobile station (MS) in a GSM network. In some embodiments, the cache memory data compression and decompression module 107 and 200 may be implemented in the SCC 1100. For example, the cache memory data compression and decompression module 107 and 200 may be implemented in the core 1106 and/or core 1107.

Here, SOC 1100 includes two cores—1106 and 1107. Similar to the discussion above, cores 1106 and 1107 may conform to an Instruction Set Architecture, such as a processor having the Intel® Architecture Core™, an Advanced Micro Devices, Inc. (AMD) processor, a MIPS-based processor, an ARM-based processor design, or a customer thereof, as well as their licensees or adopters. Cores 1106 and 1107 are coupled to cache control 1108 that is associated with bus interface unit 1109 and L2 cache 1110 to communicate with other parts of system 1100. Interconnect 1111 includes an on-chip interconnect, such as an IOSF, AMBA, or other interconnects discussed above, which can implement one or more aspects of the described disclosure.

Interconnect 1111 provides communication channels to the other components, such as a Subscriber Identity Module (SIM) 1130 to interface with a SIM card, a boot ROM 1135 to hold boot code for execution by cores 1106 and 1107 to initialize and boot SOC 1100, a SDRAM controller 1140 to interface with external memory (e.g. DRAM 1160), a flash controller 1145 to interface with non-volatile memory (e.g. Flash 1165), a peripheral control 1150 (e.g. Serial Peripheral Interface) to interface with peripherals, video codecs 1120 and Video interface 1125 to display and receive input (e.g. touch enabled input), GPU 1115 to perform graphics related computations, etc. Any of these interfaces may incorporate aspects of the embodiments described herein.

In addition, the system illustrates peripherals for communication, such as a Bluetooth module 1170, 3G modem 1175, GPS 1180, and Wi-Fi 1185. Note as stated above, a UE includes a radio for communication. As a result, these peripheral communication modules may not all be included. However, in a UE some form of a radio for external communication should be included.

Figure 12:
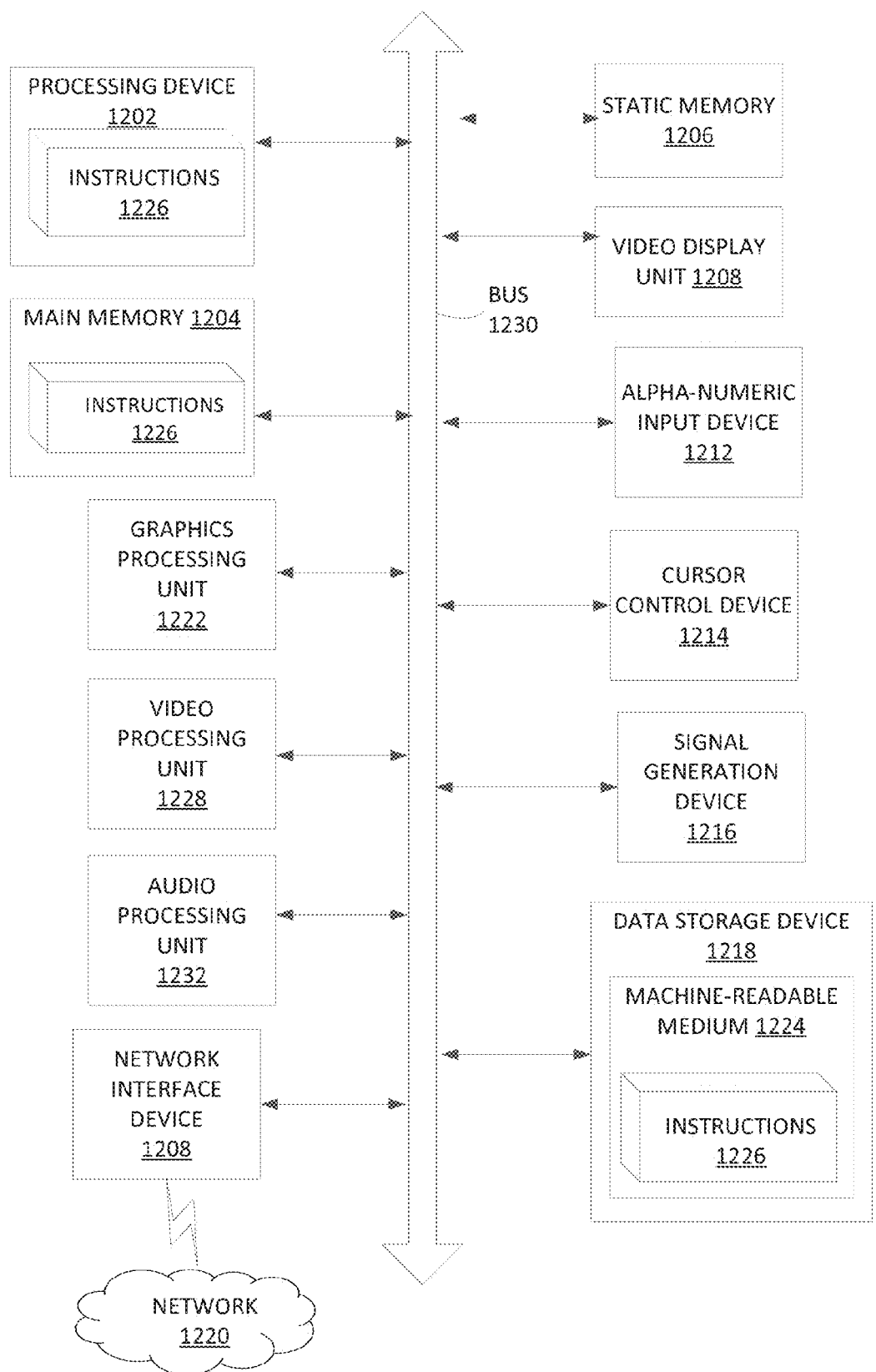
FIG. 12 illustrates another implementation of a block diagram for a computing system.

FIG. 12 illustrates a diagrammatic representation of a machine in the example form of a computing system 1200 within which a set of instructions, for causing the machine to perform any one or more of the methodologies discussed herein, may be executed. In alternative embodiments, the machine may be connected (e.g., networked) to other machines in a LAN, an intranet, an extranet, or the Internet. The machine may operate in the capacity of a server or a client device in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The computing system 1200 includes a processing device 1202, main memory 1204 (e.g., read-only memory (ROM), flash memory, dynamic random access memory (DRAM) (such as synchronous DRAM (SDRAM) or DRAM (RDRAM), etc.), a static memory 1206 (e.g., flash memory, static random access memory (SRAM), etc.), and a data storage device 1218, which communicate with each other via a bus 1230. In some embodiments, the cache memory data compression and decompression module 107 and 200 may be implemented in the system 1200. For example, the cache memory data compression and decompression module 107 and 200 may be implemented in the processing device 1202 and/or be stored in the instructions 1226.

Processing device 1202 represents one or more general-purpose processing devices such as a microprocessor, central processing unit, or the like. More particularly, the processing device may be complex instruction set computing (CISC) microprocessor, reduced instruction set computer (RISC) microprocessor, very long instruction word (VLIW) microprocessor, or processor implementing other instruction sets, or processors implementing a combination of instruction sets. Processing device 1202 may also be one or more special-purpose processing devices such as an application specific integrated circuit (ASIC), a field programmable gate array (FPGA), a digital signal processor (DSP), network processor, or the like. In one embodiment, processing device 1202 may include one or processing cores. The processing device 1202 is configured to execute the processing logic 1226 for performing the operations discussed herein. In one embodiment, processing device 1202 can be part of the computing system 100 of FIG. 1. Alternatively, the computing system 1200 can include other components as described herein. It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

The computing system 1200 may further include a network interface device 1208 communicably coupled to a network 1220. The computing system 1200 also may include a video display unit 1210 (e.g., a liquid crystal display (LCD) or a cathode ray tube (CRT)), an alphanumeric input device 1212 (e.g., a keyboard), a cursor control device 1214 (e.g., a mouse), a signal generation device 1216 (e.g., a speaker), or other peripheral devices. Furthermore, computing system 1200 may include a graphics processing unit 1222, a video processing unit 1228 and an audio processing unit 1232. In another embodiment, the computing system 1200 may include a chipset (not illustrated), which refers to a group of integrated circuits, or chips, that are designed to work with the processing device 1202 and controls communications between the processing device 1202 and external devices. For example, the chipset may be a set of chips on a motherboard that links the processing device 1202 to very high-speed devices, such as main memory 1204 and graphic controllers, as well as linking the processing device 1202 to lower-speed peripheral buses of peripherals, such as USB, PCI or ISA buses.

The data storage device 1218 may include a computer-readable storage medium 1224 on which is stored software 1226 embodying any one or more of the methodologies of functions described herein. The software 1226 may also reside, completely or at least partially, within the main memory 1204 as instructions 1226 and/or within the processing device 1202 as processing logic 1226 during execution thereof by the computing system 1200; the main memory 1204 and the processing device 1202 also constituting computer-readable storage media.

The computer-readable storage medium 1224 may also be used to store instructions 1226 utilizing the processing device 1202, such as described with respect to FIG. 1, and/or a software library containing methods that call the above applications. While the computer-readable storage medium 1224 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing, encoding or carrying a set of instruction for execution by the machine and that cause the machine to perform any one or more of the methodologies of the present embodiments. The term "computer-readable storage medium" shall accordingly be taken to include, but not be limited to, solid-state memories, and optical and magnetic media.

The following examples pertain to further embodiments.

Example 1 is a processor comprising a cache memory, a memory channel coupled to a main memory, and a memory controller unit (MCU) coupled to the cache memory and the memory channel. The MCU comprises a cache memory data compression and decompression (CMDCD) module comprising cache memory data compression function block operable to receive a cache line from the main memory over the memory channel, split the cache line into a first portion of data blocks and a second portion of data blocks, compress a first data block of the first portion into a first compressed data block based on matching contents of the first data block with contents of other data blocks from the same first portion, compress a second data block of the second portion into a second compressed data block based on matching contents of the second data block with contents of other data blocks from the same second portion, and store the first portion comprising the first compressed data block and the second portion comprising the second compressed data block in the cache memory.

In Example 2, the CMDCD module of Example 1 further comprises a cache memory data decompression function block operable to decompress the first compressed data block of the first portion stored in the cache memory in response to a cache hit associated with the processor and decompress the second compressed data block of the second portion stored in the cache memory in response to the cache hit associated with the processor.

In Example 3, in the processor of any of Examples 1-2, each data block is a data unit operated upon by an instruction set associated with the processor.

In Example 4, in the processor of any of Examples 1-3, each data block is a doubleword.

In Example 5, in the processor of any of Examples 1-4, the matching of the contents by the CMDCD module to compress the first and second data blocks is limited to a previous data block and a data block before the previous data block within the same portion.

In Example 6, in the processor of any of Examples 1-5, the contents of the first data block are further matched with a first predefined bit pattern corresponding to a first encoding used to compress the first data block and the contents of the second data block are further matched with a second predefined bit pattern corresponding to a second encoding used to compress the second data block.

In Example 7, in the processor of any of Examples 1-6, the first portion comprising the first compressed data block further comprises a first prefix field comprising a first prefix entry corresponding to a first encoding of a pattern used to compress the first data block and the second portion comprising the second compressed data block further comprises a second prefix field comprising a second prefix entry corresponding to a second encoding of a pattern used to compress the second data block.

In Example 8, in the processor of any of Examples 1-7, the first prefix field is at the start of the first portion and the second prefix field is at the start of the second portion.

In Example 9, in the processor of any of Examples 1-8, the compressing of the first data block of the first portion and the second data block of the second portion by the cache memory data compression function block is performed over two cycles such that the first data block is compressed in a first cycle and the second data block is compressed in a second cycle after the first cycle.

In Example 10, a method comprises receiving, by a cache memory data compression and decompression (CMDCD) module of a memory controller unit (MCU) of a processor, a cache line, splitting, by the CMDCD module, the cache line into a first portion of data blocks and a second portion of data blocks, compressing, by the CMDCD module, a first data block of the first portion into a first compressed data block based on matching contents of the first data block with contents of other data blocks from the same first portion, compressing, by the CMDCD module, a second data block of the second portion into a second compressed data block based on matching contents of the second data block with contents of other data blocks from the same second portion, and storing, by the CMDCD module, the first portion comprising the first compressed data block and the second portion comprising the second compressed data block in a cache memory.

In Example 11, the method of Example 10 further comprises decompressing, by the CMDCD module, the first compressed data block of the first portion stored in the cache memory in response to a cache hit associated with the processor and decompressing, by the CMDCD module, the second compressed data block of the second portion stored in the cache memory in response to the cache hit associated with the processor.

In Example 12, in the method of any of Examples 10-11, each data block is a data unit operated upon by an instruction set associated with the processor.

In Example 13, in the method of any of Examples 10-12, each data block is a doubleword.

In Example 14, in the method of any of Examples 10-13, the matching of the contents to compress the first and second data blocks is limited to a previous data block and a data block before the previous data block within the same portion.

In Example 15, in the method of any of Examples 10-14, the contents of the first data block are further matched with a first predefined bit pattern corresponding to a first encoding used to compress the first data block and the contents of the second data block are further matched with a second predefined bit pattern corresponding to a second encoding used to compress the second data block.

In Example 16, in the method of any of Examples 10-15, the first portion comprising the first compressed data block further comprises a first prefix field comprising a first prefix entry corresponding to a first encoding of a pattern used to compress the first data block and the second portion comprising the second compressed data block further comprises a second prefix field comprising a second prefix entry corresponding to a second encoding of a pattern used to compress the second data block.

In Example 17, in the method of any of Examples 10-16, the first prefix field is at the start of the first portion and the second prefix field is at the start of the second portion.

In Example 18, in the method of any of Examples 10-17, the compressing of the first data block of the first portion and the second data block of the second portion of the cache line by the cache memory data compression function block is performed over two cycles such that the first data block of the first portion of the cache line is compressed in a first cycle and the second data block of the second portion of the cache line is compressed in a second cycle after the first cycle.

Various embodiments may have different combinations of the structural features described above. For instance, all optional features of the processors and methods described above may also be implemented with a processor described herein and specifics in the examples may be used anywhere in one or more embodiments.

Example 19 is an integrated circuit comprising a processor core, a cache memory operable to store data, and a memory controller unit (MCU) coupled between the processor core and the cache memory, wherein the MCU is configured to receive a cache line from a main memory, split the cache line from the main memory into a first portion of data blocks and a second portion of data blocks, compress, at a first cycle associated with the processor core, a first data block of the first portion into a first compressed data block based on matching contents of the first data block with contents of other data blocks within the same first portion of the cache line, compress, at a second cycle associated with the processor core, a second data block of the second portion into a second compressed data block based on matching contents of the second data block with contents of other data blocks within the same second portion of the cache line, and store the first portion comprising the first compressed data block and the second portion comprising the second compressed data block in the cache memory.

In Example 20, in the integrated circuit of Example 19, the MCU is further configured to decompress the first compressed data block of the first portion of the cache line stored in the cache memory in response to a cache hit associated with the processor core and decompress the second compressed data block of the second portion of the cache line stored in the cache memory in response to the cache hit associated with the processor core.

In Example 21, in the integrated circuit of any of Examples 19-20, the first portion comprising the first compressed data block further comprises a first prefix field comprising a first prefix entry corresponding to a first encoding of a pattern used to compress the first data block and the second portion comprising the second compressed data block further comprises a second prefix field comprising a second prefix entry corresponding to a second encoding of a pattern used to compress the second data block.

In Example 22, in the integrated circuit of any of Examples 19-21, the decompressing of the first compressed data blocks is based on the first prefix entry and the decompressing of the second compressed data block is based on the second prefix entry.

In Example 23, in the integrated circuit of any of Examples 19-22, the matching of the contents by the MCU to compress the first and second data blocks is limited to a previous data block and a data block before the previous data block within the same portion.

Various embodiments may have different combinations of the operational features described above. For instance, all optional features of the method described above may also be implemented with respect to a non-transitory computer-readable storage medium. Specifics in the examples may be used anywhere in one or more embodiments.

Example 24 is a non-transitory computer-readable storage medium including instructions that, when executed by a processor, cause the processor to perform the method of Examples 10-18.

Example 25 is a system comprising a system on a chip (SOC) that comprises a plurality of functional units and a memory controller unit (MCU) coupled to the plurality of functional units. The MCU comprises a cache memory data compression and decompression (CMDCD) module comprising a cache memory data compression function block operable to receive a cache line from a main memory, split the cache line into a first portion of data blocks and a second portion of data blocks, compress a first data block of the first portion into a first compressed data block based on matching contents of the first data block with contents of other data blocks from the same first portion, compress a second data block of the second portion into a second compressed data block based on matching contents of the second data block with contents of other data blocks from the same second portion, and store the first portion comprising the first compressed data block and the second portion comprising the second compressed data block in a cache memory.

In Example 26, the SOC of Example 25 further comprises the subject matter of Examples 1-9.

In Example 27, in the SOC of Example 25, the cache memory data compression function block is further operable to perform the subject matter of Examples 10-18.

In Example 28, the SOC of Example 25 further comprises subject matter of Examples 19-23.

Example 29 is an apparatus comprising means for receiving a cache line from a main memory, means for splitting the cache line into a first portion of data blocks and a second portion of data blocks, means for compressing a first data block of the first portion into a first compressed data block based on matching contents of the first data block with contents of other data blocks from the same first portion, means for compressing a second data block of the second portion into a second compressed data block based on matching contents of the second data block with contents of other data blocks from the same second portion, and means for storing the first portion comprising the first compressed data block and the second portion comprising the second compressed data block in a cache memory.

In Example 30, the apparatus of Example 29 further comprises the subject matter of any of Examples 1-9 and 20-23.

Example 31 is an apparatus comprising a cache memory and a processor comprising a memory controller unit (MCU) comprising a cache memory data compression and decompression (CMDCD) module, where the CMDCD module is configured to perform the method of any of Examples 10-18.

In Example 32, the apparatus of Example 31 further comprises the subject matter of any of Examples 1-9 and 19-28.

While the present disclosure has been described with respect to a limited number of embodiments, those skilled in the art will appreciate numerous modifications and variations therefrom. It is intended that the appended claims cover all such modifications and variations as fall within the true spirit and scope of this present disclosure.

In the description herein, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present disclosure. It will be apparent, however, to one skilled in the art that these specific details need not be employed to practice the present disclosure. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system have not been described in detail in order to avoid unnecessarily obscuring the present disclosure.

The embodiments are described with reference to cache memory data compression and decompression in specific integrated circuits, such as in computing platforms or microprocessors. The embodiments may also be applicable to other types of integrated circuits and programmable logic devices. For example, the disclosed embodiments are not limited to desktop computer systems or portable computers, such as the Intel® Ultrabooks™ computers. And may be also used in other devices, such as handheld devices, tablets, other thin notebooks, systems on a chip (SOC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. It is described that the system can be any kind of computer or embedded system. The disclosed embodiments may especially be used for low-end devices, like wearable devices (e.g., watches), electronic implants, sensory and control infrastructure devices, controllers, supervisory control and data acquisition (SCADA) systems, or the like. Moreover, the apparatuses, methods, and systems described herein are not limited to physical computing devices, but may also relate to software optimizations for energy conservation and efficiency. As will become readily apparent in the description below, the embodiments of methods, apparatuses, and systems described herein (whether in reference to hardware, firmware, software, or a combination thereof) are vital to a 'green technology' future balanced with performance considerations.

Although the embodiments herein are described with reference to a processor, other embodiments are applicable to other types of integrated circuits and logic devices. Similar techniques and teachings of embodiments of the present disclosure can be applied to other types of circuits or semiconductor devices that can benefit from higher pipeline throughput and improved performance. The teachings of embodiments of the present disclosure are applicable to any processor or machine that performs data manipulations. However, the present disclosure is not limited to processors or machines that perform 512 bit, 256 bit, 128 bit, and 64 bit, 32 bit, or 16 bit data operations and can be applied to any processor and machine in which manipulation or management of data is performed. In addition, the description herein provides examples, and the accompanying drawings show various examples for the purposes of illustration. However, these examples should not be construed in a limiting sense as they are merely intended to provide examples of embodiments of the present disclosure rather than to provide an exhaustive list of all possible implementations of embodiments of the present disclosure.

Although the below examples describe instruction handling and distribution in the context of execution units and logic circuits, other embodiments of the present disclosure can be accomplished by way of a data or instructions stored on a machine-readable, tangible medium, which when performed by a machine cause the machine to perform functions consistent with at least one embodiment of the disclosure. In one embodiment, functions associated with embodiments of the present disclosure are embodied in machine-executable instructions. The instructions can be used to cause a general-purpose or special-purpose processor that is programmed with the instructions to perform the steps of the present disclosure. Embodiments of the present disclosure may be provided as a computer program product or software which may include a machine or computer-readable medium having stored thereon instructions which may be used to program a computer (or other electronic devices) to perform one or more operations according to embodiments of the present disclosure. Alternatively, operations of embodiments of the present disclosure might be performed by specific hardware components that contain fixed-function logic for performing the operations, or by any combination of programmed computer components and fixed-function hardware components.

Instructions used to program logic to perform embodiments of the disclosure can be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'to,' 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer)

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like. The blocks described herein can be hardware, software, firmware or a combination thereof.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "defining," "receiving," "determining," "issuing," "linking," "associating," "obtaining," "authenticating," "prohibiting," "executing," "requesting," "communicating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or" That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such. Also, the terms "first," "second," "third," "fourth," etc. as used herein are meant as labels to distinguish among different elements and may not necessarily have an ordinal meaning according to their numerical designation.

What is claimed is:

1. A processor comprising:
   a cache memory;
   a memory channel coupled to a main memory; and
   a memory controller unit (MCU) coupled to the cache memory and the memory channel, wherein the MCU comprises a cache memory data compression and decompression (CMDCD) module comprising:
   a cache memory data compression function block to:
      receive a cache line from the main memory over the memory channel;
      split the cache line into a first portion of data blocks and a second portion of data blocks prior to compression of the cache line;
      compress a first data block of the first portion into a first compressed data block based on matching contents of the first data block with contents of other data blocks from the same first portion;
      compress a second data block of the second portion into a second compressed data block based on matching contents of the second data block with contents of other data blocks from the same second portion; and
      store the first portion comprising the first compressed data block and the second portion comprising the second compressed data block in the cache memory.

2. The processor of claim 1, wherein the CMDCD module further comprises a cache memory data decompression function block to:

decompress the first compressed data block stored in the cache memory in response to a cache hit associated with the processor; and decompress the second compressed data block stored in the cache memory in response to the cache hit associated with the processor.

3. The processor of claim 1, wherein each data block in the first portion of data blocks and the second portion of data blocks is a data unit operated upon by an instruction set associated with the processor.

4. The processor of claim 3, wherein each data block in the first portion of data blocks and the second portion of data blocks is a doubleword.

5. The processor of claim 1, wherein the matching of the contents to compress the first data block and the second data block is limited to a previous data block and a data block before the previous data block within the same first portion or the same second portion.

6. The processor of claim 5, wherein the contents of the first data block are further matched with a first predefined bit pattern corresponding to a first encoding used to compress the first data block, and wherein the contents of the second data block are further matched with a second predefined bit pattern corresponding to a second encoding used to compress the second data block.

7. The processor of claim 1, wherein the first portion further comprises a first prefix field comprising a first prefix entry corresponding to a first encoding of a pattern used to compress the first data block, and wherein the second portion further comprises a second prefix field comprising a second prefix entry corresponding to a second encoding of a pattern used to compress the second data block.

8. The processor of claim 7, wherein the first prefix field is at the start of the first portion and the second prefix field is at the start of the second portion.

9. The processor of claim 1, wherein the compressing of the first data block and the second data block by the cache memory data compression function block is performed over two cycles of the processor such that the first data block is compressed in a first cycle and the second data block is compressed in a second cycle after the first cycle.

10. A method comprising:
receiving, by a cache memory data compression and decompression (CMDCD) module of a memory controller unit (MCU) of a processor, a cache line;
splitting, by the CMDCD module, the cache line into a first portion of data blocks and a second portion of data blocks prior to compression of the cache line;
compressing, by the CMDCD module, a first data block of the first portion into a first compressed data block based on matching contents of the first data block with contents of other data blocks from the same first portion;
compressing, by the CMDCD module, a second data block of the second portion into a second compressed data block based on matching contents of the second data block with contents of other data blocks from the same second portion; and
storing, by the CMDCD module, the first portion comprising the first compressed data block and the second portion comprising the second compressed data block in a cache memory.

11. The method of claim 10, further comprising:
decompressing, by the CMDCD module, the first compressed data block stored in the cache memory in response to a cache hit associated with the processor; and decompressing, by the CMDCD module, the second compressed data block of the stored in the cache memory in response to the cache hit associated with the processor.

12. The method of claim 10, wherein each data block in the first portion of data blocks and the second portion of data blocks is a data unit operated upon by an instruction set associated with the processor.

13. The method of claim 12, wherein each data block in the first portion of data blocks and the second portion of data blocks is a doubleword.

14. The method of claim 10, wherein the matching of the contents to compress the first data block and the second data block is limited to a previous data block and a data block before the previous data block within the same first portion or the same second portion.

15. The method of claim 14, wherein the contents of the first data block are further matched with a first predefined bit pattern corresponding to a first encoding used to compress the first data block, and wherein the contents of the second data block are further matched with a second predefined bit pattern corresponding to a second encoding used to compress the second data block.

16. The method of claim 10, wherein the first portion further comprises a first prefix field comprising a first prefix entry corresponding to a first encoding of a pattern used to compress the first data block, and wherein the second portion further comprises a second prefix field comprising a second prefix entry corresponding to a second encoding of a pattern used to compress the second data block.

17. The method of claim 16, wherein the first prefix field is at the start of the first portion and the second prefix field is at the start of the second portion.

18. The method of claim 10, wherein the compressing of the first data block and the second data block by the CMDCD module is performed over two cycles of the processor such that the first data block is compressed in a first cycle and the second data block is compressed in a second cycle after the first cycle.

19. An integrated circuit comprising:
a processor core;
a cache memory to store data; and
a memory controller unit (MCU) coupled between the processor core and the cache memory to:
receive a cache line from a main memory;
split the cache line from the main memory into a first portion of data blocks and a second portion of data blocks prior to compression of the cache line;
compress, at a first cycle associated with the processor core, a first data block of the first portion into a first compressed data block based on matching contents of the first data block with contents of other data blocks from the same first portion;
compress, at a second cycle associated with the processor core after the first cycle, a second data block of the second portion into a second compressed data block based on matching contents of the second data block with contents of other data blocks from the same second portion; and
store the first portion comprising the first compressed data block and the second portion comprising the second compressed data block in the cache memory.

20. The integrated circuit of claim 19, wherein the MCU is further to:
decompress the first compressed data block stored in the cache memory in response to a cache hit associated with the processor core; and decompress the second compressed data block stored in the cache memory in response to the cache hit associated with the processor core.

21. The integrated circuit of claim 20, wherein the first portion further comprises a first prefix field comprising a first prefix entry corresponding to a first encoding of a pattern used to compress the first data block, and wherein the second portion further comprises a second prefix field comprising a second prefix entry corresponding to a second encoding of a pattern used to compress the second data block.

22. The integrated circuit of claim 21, wherein the decompressing of the first compressed data block is based on the first prefix entry, and wherein the decompressing of the second compressed data block is based on the second prefix entry.

23. The integrated circuit of claim 19, wherein the matching of the contents to compress the first data block and the second data block is limited to a previous data block and a data block before the previous data block within the same first portion or the same second portion.

* * * * *